US012765250B2

(12) United States Patent
Snaith et al.

(10) Patent No.: US 12,765,250 B2
(45) Date of Patent: Oct. 13, 2026

(54) PROCESS FOR PRODUCING A LAYER WITH MIXED SOLVENT SYSTEM

(71) Applicant: OXFORD PHOTOVOLTAICS LIMITED, Oxford (GB)

(72) Inventors: Henry James Snaith, Oxford (GB); Bernard Wenger, Oxford (GB); Pabitra Kumar Nayak, Oxford (GB); Nakita Kimberly Noel, Oxford (GB)

(73) Assignee: OXFORD PHOTOVOLTAICS LIMITED, Oxford (GB)

( * ) Notice: Subject to any disclaimer, the term of this patent is extended or adjusted under 35 U.S.C. 154(b) by 241 days.

(21) Appl. No.: 18/608,872

(22) Filed: Mar. 18, 2024

(65) Prior Publication Data

US 2024/0276857 A1 Aug. 15, 2024

Related U.S. Application Data

(63) Continuation of application No. 17/287,316, filed as application No. PCT/GB2019/052984 on Oct. 18, 2019, now Pat. No. 11,943,993.

(30) Foreign Application Priority Data

Oct. 22, 2018 (GB) ...................................... 1817167

(51) Int. Cl.
*H10K 71/15* (2023.01)
*H10K 85/20* (2023.01)
(Continued)

(52) U.S. Cl.
CPC ........... *H10K 71/15* (2023.02); *H10K 85/215* (2023.02); *H10K 85/30* (2023.02); *H10K 85/50* (2023.02);
(Continued)

(58) Field of Classification Search
None
See application file for complete search history.

(56) References Cited

U.S. PATENT DOCUMENTS

2017/0033299 A1 2/2017 Satou et al.
2017/0125172 A1 5/2017 Gong
(Continued)

FOREIGN PATENT DOCUMENTS

CN 105390613 A 3/2016
CN 106062983 10/2016
(Continued)

OTHER PUBLICATIONS

Cho, J, et al. "Ligand-mediated modulation of layer thicknesses of perovskite methylammonium lead bromide nanoplatelets." Chemistry of Materials 28.19 (2016): 6909-6916. (including supporting materials).

(Continued)

*Primary Examiner* — Anthony Ho
(74) *Attorney, Agent, or Firm* — QUARLES & BRADY LLP

(57) ABSTRACT

The present invention relates to a process for producing a layer of a crystalline A/M/X material, which crystalline A/M/X material comprises a compound of formula $[A]_a[M]_b[X]_c$, wherein: [M] comprises one or more first cations, which one or more first cations are metal or metalloid cations; [A] comprises one or more second cations; [X] comprises one or more halide anions; a is an integer from 1 to 6; b is an integer from 1 to 6; and c is an integer from 1 to 18, wherein the process comprises disposing on a substrate a precursor composition comprising: (a) a first precursor compound comprising a first cation (M), which first cation is a metal or metalloid cation; and (b) a solvent, and wherein the solvent comprises: (i) a non-polar organic solvent which is a hydrocarbon solvent, a chlorohydrocar-
(Continued)

bon solvent or an ether solvent; and (ii) a first organic amine comprising at least three carbon atoms. Also described are compositions useful in the process of the invention.

12 Claims, 6 Drawing Sheets

(51) Int. Cl.

| | |
|---|---|
| ***H10K 85/30*** | (2023.01) |
| ***H10K 85/50*** | (2023.01) |
| *H10K 30/30* | (2023.01) |
| *H10K 30/40* | (2023.01) |
| *H10K 30/50* | (2023.01) |

(52) U.S. Cl.

CPC ............ *H10K 30/30* (2023.02); *H10K 30/40* (2023.02); *H10K 30/50* (2023.02)

(56) References Cited

U.S. PATENT DOCUMENTS

| | | | |
|---|---|---|---|
| 2017/0283693 | A1 | 10/2017 | Ma |
| 2017/0365418 | A1 | 12/2017 | Schumann et al. |

FOREIGN PATENT DOCUMENTS

| | | | |
|---|---|---|---|
| CN | 2016183273 | A1 | 11/2016 |
| CN | 106233484 | | 12/2016 |
| CN | 106796988 | | 5/2017 |
| CN | 107001596 | | 8/2017 |
| CN | 2017153752 | A1 | 9/2017 |
| CN | 2018021966 | A2 | 2/2018 |
| CN | 108428797 | A | 8/2018 |
| CN | 108502918 | A | 9/2018 |
| CN | 108504355 | A | 9/2018 |
| CN | 108504356 | A | 9/2018 |
| WO | 2015092397 | A1 | 6/2015 |
| WO | 2016020699 | A1 | 2/2016 |

OTHER PUBLICATIONS

Haber, J. "Manual on catalyst characterization (Recommendations 1991)." Pure and applied chemistry 63.9 (1991): 1227-1246.

Kim, Y, et al. "Pure Cubic-Phase Hybrid lodobismuthates AgBi2I7 for Thin-Film Photovoltaics." Angewandte Chemie International Edition 55.33 (2016): 9586-9590.

Noel, N. K., et al. "A low viscosity, low boiling point, clean solvent system for the rapid crystallisation of highly specular perovskite films." Energy & Environmental Science 10.1 (2017): 145-152.

Rouquerol, J., et al. "Recommendations for the characterization of porous solids (Technical Report)." Pure and applied chemistry 66.8 (1994): 1739-1758.

Sing, KSW. "Reporting physisorption data for gas/solid systems with special reference to the determination of surface area and porosity." Pure and applied chemistry 57.4 (1985): 603-619.

Xu, J, et al. "Perovskite-fullerene hybrid materials suppress hysteresis in planar diodes." Nature communications 6.1 (2015): 1-8.

Zhou, Z., et al. "Methylamine-Gas-Induced Defect-Healing Behavior of CH3NH3PbI3 Thin Films for Perovskite Solar Cells." Angewandte Chemie (International ed. in English) 54.33 (2015): 9705-9709.

Vybornyi et al. "Polar-solvent-free colloidal synthesis of highly luminescent alkylammonium lead halide perovskite nanocrystals." Nanoscale 8.12 (2016): 6278-6283.

PROCESS FOR PRODUCING A LAYER WITH MIXED SOLVENT SYSTEM

CROSS-REFERENCE TO RELATED APPLICATIONS

This application is a continuation of U.S. application Ser. No. 17/287,316, now issued as U.S. Pat. No. 11,943,993, filed Apr. 21, 2021, which is a 371 application and represents the national stage entry of PCT International Application No. PCT/GB2019/052984 filed Oct. 18, 2019, which claims priority to Great Britain Patent Application 1817167.8 filed Oct. 22, 2018, the contents of all of which are hereby incorporated herein by reference for all purposes.

FIELD OF THE INVENTION

The present invention relates to a process for producing a layer of a crystalline A/M/X material. The invention also relates to a process for producing a semiconductor device, as well as a composition useful in the described processes.

The project leading to this application has received funding from the European Union's Horizon 2020 research and innovation programme under the Marie Sklodowska-Curie grant agreement n° 706552. The project leading to this application has received funding from the European Union's Horizon 2020 research and innovation programme under the Marie Sklodowska-Curie grant agreement n° 653184.

BACKGROUND OF THE INVENTION

Crystalline A/M/X materials such as metal halide perovskites are extremely promising photoactive materials. They have been used to fabricate various optoelectronic devices such as solar cells, light emitting diodes and lasers. Photovoltaic devices based on perovskite materials are the most established of the metal halide perovskite-based technologies to date, achieving certified power conversion efficiencies approaching 23% on lab-scale devices. The ease of fabrication of these materials is one of their most attractive qualities, with high quality crystalline layers being produced from simple methods such as spin coating.

One of the disadvantages of solution processing these materials, and a potential barrier to the scale-up and commercialization of this technology, is the use of solvents which have high boiling points, are highly coordinating, and have high toxicity. Strong solvents of this type are required for the complexation and subsequent dissolution of the lead halide salts which are used as precursors for the perovskite material. The most widely used solvents in the solution processing and crystal growth of lead halide perovskites are dimethylformamide (DMF), dimethylsulfoxide (DMSO) and gamma-butyrolactone (GBL) or mixtures thereof. Other solvents which have been employed include dimethylacetamide (DMA) and N-methyl-2-pyrrolidone (NMP). In addition to the toxicity concerns associated with the use of DMF, it has been found that the degradation of this solvent can directly affect the colloid distribution in perovskite precursor solutions, and thus the optoelectronic properties of the films.

Attempts have been made to reduce the solvent toxicity of A/M/X material precursor solutions. One approach involves reducing the overall volume of the solvents such as DMF and DMSO by substituting with less toxic co-solvents. WO 2017/153752 A1 describes a low boiling point compound solvent system with reduced toxicity which comprises an alkylamine such as methylamine (MA) which is bubbled into a host solvent acetonitrile (ACN) to promote the dissolution of the perovskite salts.

It is often desirable to deposit a crystalline A/M/X material such as a perovskite together with a polymer or small organic molecule (for instance in a bulk heterojunction or bulk heterostructure device). For this to be done effectively, it is preferable to co-solubilise the A/M/X material precursors with the polymer or small organic molecule. A significant difficulty in doing this is that the solubility of the organic material (i.e. the polymer or small organic molecule) typically has low solubility in the solvent used for the A/M/X material or perovskite (such as DMF). The reduced solubility of organic materials (such as the fullerene derivative PCBM) and polymers (such as PMMA) in the perovskite solvent typically causes the organic species to precipitate out of the solution at relatively low concentrations. This, in turn, results in poor film formation during the crystallisation of the perovskite material.

A solution to this problem would be to use a solvent in which both the perovskite precursor materials and the organic materials are soluble. However, this is not easily done as the perovskite precursor materials are typically soluble in highly polar protic solvents, whereas organic materials are typically soluble in non-polar solvents. There is a need to develop a solvent system which is able to co-solubilise perovskite precursor compounds with organic materials such as polymers.

SUMMARY OF THE INVENTION

The inventors have found that a specific solvent system comprising (i) a non-polar organic solvent and (ii) a first organic amine comprising at least three carbon atoms is able to solubilise both a first precursor compound comprising a metal cation and an organic material. This solvent system can advantageously be used to deposit both neat films of an A/M/X material as well as bulk heterojunction films comprising an A/M/X material and an organic material. The solvent system also does not comprise toxic, high boiling point solvents such as DMF and DMSO. The solvent system used in the process of the invention accordingly provides a significant advance in the development of flexible procedures for depositing A/M/X materials (such as perovskites) alone or in combination with organic materials.

The invention provides a process for producing a layer of a crystalline A/M/X material, which crystalline A/M/X material comprises a compound of formula $[A]_a[M]_b[X]_c$, wherein: [M] comprises one or more first cations, which one or more first cations are metal or metalloid cations; [A] comprises one or more second cations; [X] comprises one or more halide anions; a is an integer from 1 to 6; b is an integer from 1 to 6; and c is an integer from 1 to 18, wherein the process comprises disposing on a substrate a precursor composition comprising: (a) a first precursor compound comprising a first cation (M), which first cation is a metal or metalloid cation; and (b) a solvent, and wherein the solvent comprises: (i) a non-polar organic solvent which is a hydrocarbon solvent, a chlorohydrocarbon solvent or an ether solvent; and (ii) a first organic amine comprising at least three carbon atoms.

The invention also provides a process for producing a semiconductor device, which process comprises a process for producing a layer of a crystalline A/M/X material as defined herein.

Further provided by the invention is a composition comprising:

(i) a compound of formula $MX_n$, wherein: M is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ or $Te^{4+}$, preferably $Cu^{2+}$, $Pb^{2+}$, $Ge^{2+}$ or $Sn^{2+}$; X is $I^-$, $Br^-$, $Cl^-$ or $F^-$; and n is 2, 3 or 4;

(ii) a compound of formula AX, wherein A is $(R^1NH_3)^+$, $(NR^2_4)^+$ and $(H_2N—C(R^1)═NH_2)^+$, wherein $R^1$ is H or an unsubstituted $C_{1-6}$ alkyl group and each $R^2$ is an unsubstituted $C_{1-6}$ alkyl group, and X is $I^-$, $Br^-$, $Cl^-$ or $F^-$;

(iii) a non-polar organic solvent which is a hydrocarbon solvent, a chlorohydrocarbon solvent or an ether solvent; and (iv) a first organic amine comprising at least three carbon atoms.

DETAILED DESCRIPTION OF THE INVENTION

Definitions

Figure 1:
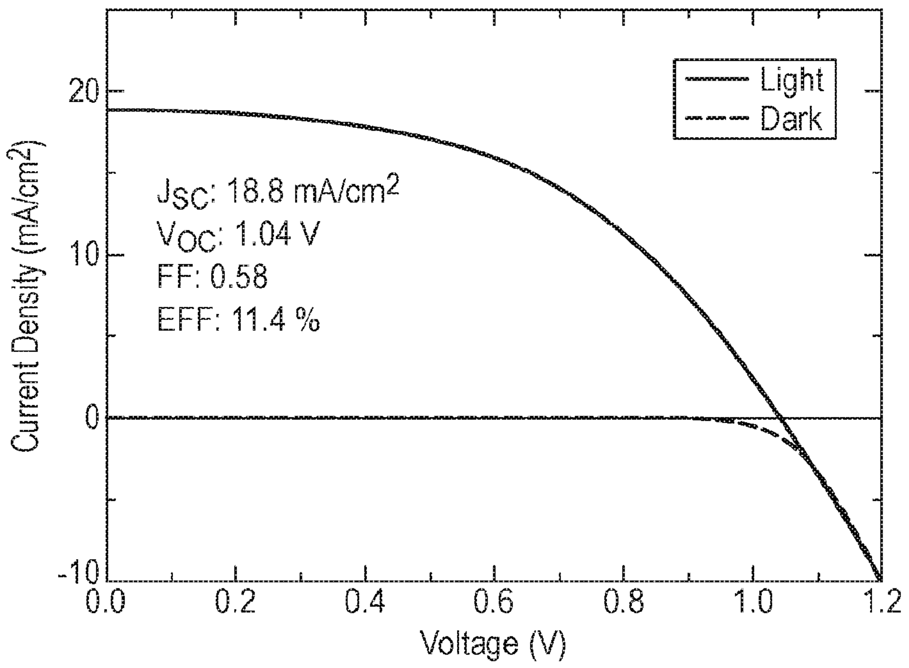
FIG. 1 shows current-voltage characteristics of a device comprising a methylammonium/butylammonium lead triiodide perovskite deposited from a butylamine/toluene solution (50:50 v/v). The perovskite is likely to have the Ruddlesden-Popper chemical structure of $MA_{n-1}BA_2Pb_nI_{3n+1}$, where MA is methylammonium and BA is butylammonium.

The term "crystalline A/M/X material" as used herein refers to a material with a crystal structure which comprises one or more A ions, one or more M ions, and one or more X ions. The A ions and M ions are typically cations. The X ions are typically anions. A/M/X materials typically do not comprise any further types of ions.

The term "perovskite" as used herein refers to a material with a crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0, 0, 0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula $[A][B][X]_3$, wherein [A] is at least one cation, [B] is at least one cation and [X] is at least one anion. When the perovskite comprise more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X anion, will be lower than that of $CaTiO_3$. For layered perovskites the stoichiometry can change between the A, B and X ions. As an example, the $[A]_2[B]\ [X]_4$ structure can be adopted if the A cation has a too large an ionic radii to fit within the 3D perovskite structure. The term "perovskite" also includes A/M/X materials adopting a Ruddleson-Popper phase. Ruddleson-Popper phase refers to a perovskite with a mixture of layered and 3D components. Such perovskites can adopt the crystal structure, $A_{n-1}A'_2M_nX_{3n+1}$, where A and A' are different cations and n is an integer from 1 to 8, or from 2 to 6. The term "mixed 2D and 3D" perovskite is used to refer to a perovskite film within which there exists both regions, or domains, of $AMX_3$ and $A_{n-1}A'_2M_nX_{3n+1}$ perovskite phases.

The term "metal halide perovskite" as used herein refers to a perovskite, the formula of which contains at least one metal cation and at least one halide anion.

The term "hexahalometallate", as used herein, refers to a compound which comprises an anion of the formula $[MX_6]^{n-}$ wherein M is a metal atom, each X is independently a halide anion and n is an integer from 1 to 4. A hexahalometallate may have the structure $A_2MX_6$.

The term "monocation", as used herein, refers to any cation with a single positive charge, i.e. a cation of formula $A^+$ where A is any moiety, for instance a metal atom or an organic moiety. The term "dication", as used herein, refers to any cation with a double positive charge, i.e. a cation of formula $A^{2+}$ where A is any moiety, for instance a metal atom or an organic moiety. The term "trication", as used herein, refers to any cation with a double positive charge, i.e. a cation of formula $A^{3+}$ where A is any moiety, for instance a metal atom or an organic moiety. The term "tetracation", as used herein, refers to any cation with a quadruple positive charge, i.e. a cation of formula $A^{4+}$ where A is any moiety, for instance a metal atom.

The term "alkyl" as used herein refers to a linear or branched chain saturated hydrocarbon radical. An alkyl group may be a $C_{1-20}$ alkyl group, a $C_{1-14}$ alkyl group, a $C_{1-10}$ alkyl group, a $C_{1-6}$ alkyl group or a $C_{1-4}$ alkyl group. Examples of a $C_{1-10}$ alkyl group are methyl, ethyl, propyl, butyl, pentyl, hexyl, heptyl, octyl, nonyl or decyl. Examples of $C_{1-6}$ alkyl groups are methyl, ethyl, propyl, butyl, pentyl or hexyl. Examples of $C_{1-4}$ alkyl groups are methyl, ethyl, i-propyl, n-propyl, t-butyl, s-butyl or n-butyl. If the term "alkyl" is used without a prefix specifying the number of carbons anywhere herein, it has from 1 to 6 carbons (and this also applies to any other organic group referred to herein).

The term "cycloalkyl" as used herein refers to a saturated or partially unsaturated cyclic hydrocarbon radical. A cycloalkyl group may be a $C_{3-10}$ cycloalkyl group, a $C_{3-8}$ cycloalkyl group or a $C_{3-6}$ cycloalkyl group. Examples of a $C_{3-8}$ cycloalkyl group include cyclopropyl, cyclobutyl, cyclopentyl, cyclohexyl, cyclohexenyl, cyclohex-1,3-dienyl, cycloheptyl and cyclooctyl. Examples of a $C_{3-6}$ cycloalkyl group include cyclopropyl, cyclobutyl, cyclopentyl and cyclohexyl.

The term "alkenyl" as used herein refers to a linear or branched chain hydrocarbon radical comprising one or more double bonds. An alkenyl group may be a $C_{2-20}$ alkenyl group, a $C_{2-14}$ alkenyl group, a $C_{2-10}$ alkenyl group, a $C_{2-6}$ alkenyl group or a $C_{2-4}$ alkenyl group. Examples of a $C_{2-10}$ alkenyl group are ethenyl (vinyl), propenyl, butenyl, pentenyl, hexenyl, heptenyl, octenyl, nonenyl and decenyl. Examples of $C_{2-6}$ alkenyl groups are ethenyl, propenyl, butenyl, pentenyl and hexenyl. Examples of $C_{2-4}$ alkenyl groups are ethenyl, i-propenyl, n-propenyl, s-butenyl and n-butenyl. Alkenyl groups typically comprise one or two double bonds.

The term "alkynyl" as used herein refers to a linear or branched chain hydrocarbon radical comprising one or more triple bonds. An alkynyl group may be a $C_{2-20}$ alkynyl group, a $C_{2-14}$ alkynyl group, a $C_{2-10}$ alkynyl group, a $C_{2-6}$ alkynyl group or a $C_{2-4}$ alkynyl group. Examples of a $C_{2-10}$ alkynyl group are ethynyl, propynyl, butynyl, pentynyl, hexynyl, heptynyl, octynyl, nonynyl and decynyl. Examples of $C_{1-6}$ alkynyl groups are ethynyl, propynyl, butynyl, pentynyl and hexynyl. Alkynyl groups typically comprise one or two triple bonds.

The term "aryl" as used herein refers to a monocyclic, bicyclic or polycyclic aromatic ring which contains from 6 to 14 carbon atoms, typically from 6 to 10 carbon atoms, in the ring portion. Examples include phenyl, naphthyl, indenyl, indanyl, anthrecenyl and pyrenyl groups. The term "aryl group" as used herein includes heteroaryl groups. The term "heteroaryl" as used herein refers to monocyclic or bicyclic heteroaromatic rings which typically contains from six to ten atoms in the ring portion including one or more heteroatoms. A heteroaryl group is generally a 5- or 6-membered ring, containing at least one heteroatom selected from O, S, N, P, Se and Si. It may contain, for example, one, two or three heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl.

The term "substituted" as used herein in the context of substituted organic groups refers to an organic group which bears one or more substituents selected from C-n alkyl, aryl (as defined herein), cyano, amino, nitro, $C_{1-10}$ alkylamino, di($C_{1-10}$)alkylamino, arylamino, diarylamino, aryl($C_{1-10}$)alkylamino, amido, acylamido, hydroxy, oxo, halo, carboxy, ester, acyl, acyloxy, $C_{1-10}$ alkoxy, aryloxy, halo($C_{1-10}$)alkyl, sulfonic acid, thiol, $C_{1-10}$ alkylthio, arylthio, sulfonyl, phosphoric acid, phosphate ester, phosphonic acid and phosphonate ester. Examples of substituted alkyl groups include haloalkyl, perhaloalkyl, hydroxyalkyl, aminoalkyl, alkoxyalkyl and alkaryl groups. When a group is substituted, it may bear 1, 2 or 3 substituents. For instance, a substituted group may have 1 or 2 substitutents.

The term "porous" as used herein refers to a material within which pores are arranged. Thus, for instance, in a porous scaffold material the pores are volumes within the scaffold where there is no scaffold material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its length) as its "pore-width" (J. Rouquerol et al., "Recommendations for the Characterization of Porous Solids", Pure & Appl. Chem., Vol. 66, No. 8, pp. 1739-1758, 1994). The following distinctions and definitions were adopted in previous IUPAC documents (K. S. W. Sing, et al, Pure and Appl. Chem., vol. 57, n04, pp 603-919, 1985; and IUPAC "Manual on Catalyst Characterization", J. Haber, Pure and Appl. Chem., vol. 63, pp. 1227-1246, 1991): micropores have widths (i.e. pore sizes) smaller than 2 nm; Mesopores have widths (i.e. pore sizes) of from 2 nm to 50 nm; and Macropores have widths (i.e. pore sizes) of greater than 50 nm. In addition, nanopores may be considered to have widths (i.e. pore sizes) of less than 1 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid (e.g. a liquid, such as a solution) to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994.

Open porosity therefore refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity".

The term "without open porosity" as used herein therefore refers to a material with no effective open porosity. Thus, a material without open porosity typically has no macropores and no mesopores. A material without open porosity may comprise micropores and nanopores, however. Such micropores and nanopores are typically too small to have a negative effect on a material for which low porosity is desired.

The term "compact layer" as used herein refers to a layer without mesoporosity or macroporosity. A compact layer may sometimes have microporosity or nanoporosity.

The term "semiconductor device" as used herein refers to a device comprising a functional component which comprises a semiconductor material. This term may be understood to be synonymous with the term "semiconducting device". Examples of semiconductor devices include a photovoltaic device, a solar cell, a photo detector, a photodiode, a photosensor, a chromogenic device, a transistor, a light-sensitive transistor, a phototransistor, a solid state triode, a battery, a battery electrode, a capacitor, a super-capacitor, a light-emitting device, a laser or a light-emitting diode. The term "optoelectronic device" as used herein refers to devices which source, control or detect light. Light is understood to include any electromagnetic radiation. Examples of optoelectronic devices include photovoltaic devices, photodiodes (including solar cells), phototransistors, photomultipliers, photoresistors and light emitting diodes.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

Process

The invention provides a process for producing a layer of a crystalline A/M/X material, which crystalline A/M/X material comprises a compound of formula $[A]_a[M]_b[X]_c$, wherein: [M] comprises one or more first cations, which one or more first cations are metal or metalloid cations; [A] comprises one or more second cations; [X] comprises one or more halide anions; a is an integer from 1 to 6; b is an integer from 1 to 6; and c is an integer from 1 to 18, wherein the process comprises disposing on a substrate a precursor composition comprising: (a) a first precursor compound comprising a first cation (M), which first cation is a metal or metalloid cation; and (b) a solvent, and wherein the solvent comprises: (i) a non-polar organic solvent which is a hydrocarbon solvent, a chlorohydrocarbon solvent or an ether solvent; and (ii) a first organic amine comprising at least three carbon atoms.

Non-Polar Organic Solvent

The solvent comprises a non-polar organic solvent which is a hydrocarbon solvent, a chlorohydrocarbon solvent or an ether solvent. A non-polar organic solvent is a solvent which comprises organic molecules and which is non-polar. A non-polar solvent typically has a dipole moment of 2.0 or less.

A hydrocarbon solvent is a solvent which comprises, or consists essentially of, a hydrocarbon compound. A hydrocarbon compound is a compound which consists of hydrogen atoms and carbon atoms. The hydrocarbon solvent may for instance be: an arene which is optionally substituted with one or more $C_{1-6}$ alkyl groups such as benzene, toluene, xylene (which may be o-xylene, m-xylene, p-xylene or a mixture thereof), cumene, ethylbenzene or trimethylbenzene; an alkane such as pentane, hexane or heptane; or a cycloalkane optionally substituted with one or more $C_{1-6}$ alkyl groups such as cylcopentane or cylcohexane.

A chlorohydrocarbon solvent is a solvent which comprises, or consists essentially of, a chlorohydrocarbon compound. A chlorohydrocarbon compound is a compound which consists of hydrogen atoms, carbon atoms and one or more chlorine atoms. The hydrocarbon solvent may for instance be: a $C_{1-6}$ alkane substituted with one or more chlorine atoms such as dichloromethane, trichloromethane (chloroform) or tetrachloromethane; or an arene optionally substituted with one or more $C_{1-6}$ alkyl groups, which arene optionally substituted with one or more $C_{1-6}$ alkyl groups is substituted with one or more chlorine atoms, such as chlorobenzene or dichlorobenzene (which may be o-dichlorobenzene, m-dichlorobenzene, p-dichlorobenzene or a mixture thereof).

An ether solvent is a solvent which comprises, or consists essentially, or an ether compound. An ether compound (as used herein) is a compound which consists of hydrogen atoms, carbon atoms and one or more oxygen atoms, each of which oxygen atoms is bonded to two separate carbon atoms. The ether solvent may for instance be a compound of formula R—O—R where each R is independently an unsubstituted $C_{1-6}$ alkyl group or an arene group optionally substituted with one or more unsubstituted $C_{1-6}$ alkyl groups, and where the two R groups are optionally bonded together to form a ring, optionally with the presence of a second —O— group between the two R groups. Examples of ether solvents include anisole (methoxybenzene), diethyl ether, ethyl methyl ether, ethyl tert-butyl ether, diisopropyl ether, tetrahydrofuran, tetrahydropyran and 1,4-dioxane.

Typically, the non-polar organic solvent is toluene, benzene, xylene, chlorobenzene, dichlorobenzene, chloroform, anisole, hexane, pentane, cyclohexane or cyclopentane.

Often, the solvent comprises a non-polar organic solvent which is a hydrocarbon solvent or a chlorohydrocarbon solvent. Preferably, the non-polar organic solvent is toluene or chlorobenzene. More preferably, the non-polar organic solvent is toluene.

First Organic Amine

The solvent comprises (i) the non-polar organic solvent and (ii) the first organic amine comprising at least three carbon atoms. The solvent typically comprises greater than 60% by weight of the non-polar organic solvent and the first organic amine relative to the total weight of the solvent, for instance greater than 70% by weight. The solvent may comprise greater than 40% by weight of the non-polar organic solvent, for instance greater than 60% by weight, relative to the total weight of the solvent.

The first organic amine is typically an organic amine of formula $RNH_2$ where R is an organic group comprising at least three carbons. R typically has a molecular weight of less than 200 g/mol. R may be a hydrocarbyl group, i.e. a group which consists of hydrogen and carbon atoms.

The first organic amine is typically a first alkylamine of formula $R^ANH_2$ or a first arylamine of formula $ArNH_2$, wherein $R^A$ is a $C_{3-20}$ alkyl group optionally substituted with a phenyl group and Ar is a phenyl group optionally substituted with from one to three $C_{1-6}$ alkyl groups.

The first arylamine is typically aniline.

The first organic amine is preferably a first alkylamine which is a compound of formula $R^ANH_2$, wherein $R^A$ is a $C_{3-20}$ alkyl group optionally substituted with a phenyl group. $R^A$ is typically an unsubstituted $C_{3-10}$ alkyl group, for instance n-propyl, isopropyl, n-butyl, pentyl or hexyl. The first alkylamine is typically propylamine, butylamine, pentylamine, hexylamine or phenylethylamine. Preferably, the first alkylamine is butylamine.

The solvent typically comprises the non-polar organic solvent and the first organic amine (e.g. first alkylamine) in a volume ratio (non-polar organic solvent):(first organic amine) of from 40:1 to 1:2. In some cases, the volume ratio (non-polar organic solvent):(first organic amine) is around 1:1, for instance from 3:2 to 2:3. Preferably, the volume ratio (non-polar organic solvent):(first organic amine) is from 20:1 to 4:1, more preferably from 10:1 to 5:1. For instance, the volume of the first organic amine per ml of the non-polar organic solvent may be from 10 μl to 2000 μl, for instance from 50 μl to 300 μl.

Many A/M/X materials, such as organic mixed halide perovskites, comprise alkylammonium ions such as methylammonium. As such, the known precursor compositions for A/M/X materials comprising alkylammonium ions typically comprise alkylammonium ions. For instance, a precursor solution may comprise a solution of an alkylammonium halide, for instance methylammonium iodide. However, it should be noted that such precursor solutions do not comprise a solvent which comprises an alkylamine or an organic amine. Rather, they comprise an alkylammonium ion which is a protonated alkylamine (or an organic ammonium ion which is a protonated organic amine). Furthermore, the alkylammonium ions in such known precursor solutions are accompanied by a molar equivalent of halide counterions.

Thus, the precursor composition in the process of the invention comprises an organic amine such as an alkylamine, which organic amine is typically unprotonated. Of course, protonated alkylammonium ions may also be present if they are for instance part of the second precursor compound, but these are in addition to the solvent organic amine. Furthermore, the precursor composition comprising the solvent typically comprises a molar ratio of (organic amine):(halide ions derived from an alkylammonium halide compound) which is greater than 100:100, for instance greater than 105:100 or greater than 110:100. The molar ratio may be from 105:100 to 200:100.

Typically, the solvent in the process of the invention is produced by adding the first organic amine to the non-polar organic solvent as the first organic amine in liquid form or solid form.

Thus, the process may further comprise producing the solvent by adding the first organic amine to the non-polar organic solvent. For example, the process may further comprise adding the first alkylamine to the non-polar organic solvent. This is typically before the first (or second) precursor compound is added to the solvent to form the precursor composition. The solvent may be obtainable by mixing the non-polar organic solvent with the first organic amine in liquid form.

First Precursor Compound

The first precursor compound comprises a first cation (M), which first cation is a metal or metalloid cation. The first precursor compound typically further comprises a first anion. The first precursor compound may comprise further cations or anions. The first precursor compound may consist of one or more of the first cations and one or more of the first anions.

Typically, the first anion is a halide anion, a nitrate anion, a thiocyanate anion ($SCN^-$), a tetrafluoroborate anion ($BF_4^-$) or an organic anion. Preferably, the first anion is a halide anion or an organic anion. The first precursor compound may comprise two or more first anions, e.g. two or more halide anions.

Typically, the organic anion is an anion of formula $RCOO^-$, $ROCOO^-$, $RSO_3$, $ROP(O)(OH)O^-$ or $RO^-$, wherein R is H, substituted or unsubstituted $C_{1-10}$ alkyl, substituted or unsubstituted $C_{2-10}$ alkenyl, substituted or unsubstituted $C_{2-10}$ alkynyl, substituted or unsubstituted $C_{3-10}$ cycloalkyl, substituted or unsubstituted $C_{3-10}$ heterocyclyl or substituted or unsubstituted aryl. For instance R may be H, substituted or unsubstituted $C_{1-10}$ alkyl, substituted or unsubstituted $C_{3-10}$ cycloalkyl or substituted or unsubstituted aryl. Typically R is H substituted or unsubstituted $C_{1-6}$ alkyl or substituted or unsubstituted aryl. For instance, R may be H unsubstituted $C_{1-6}$ alkyl or unsubstituted aryl. Thus, R may be selected from H, methyl, ethyl, propyl, butyl, pentyl, hexyl, cyclopentyl, cyclohexyl and phenyl.

Often, the one or more first anions are selected from halide anions and anions of formula $RCOO^-$, wherein R is H or methyl. Typically, the first anion is $F^-$, $Cl^-$, $Br^-$, $I^-$, nitrate, formate or acetate. Preferably, the first anion is $Cl^-$, $Br^-$, $I^-$ or $F^-$. More preferably, the first anion is $Cl^-$, $Br^-$ or $I^-$.

The metal or metalloid cation may be a cation derived from any metal in groups 1 to 16 of the periodic table of the elements. The metal or metalloid cation may be any suitable metal or metalloid cation. The metal or metalloid cation may be a monocation, a dication, a trication or a tetracation. The metal or metalloid cation is typically a dication or a tetracation.

Metalloids include the following elements: B, Si, Ge, As, Sb, Te and Po. Preferably, the first cation is a metal or metalloid dication, for instance a metal dication.

Typically, the first cation which is a metal or metalloid cation is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$ $Pb^{4+}$, $Ge^{4+}$ or $Te^{4+}$. Preferably, the metal or metalloid cation is $Cu^{2+}$, $Pb^{2+}$, $Ge^{2+}$ or $Sn^{2+}$. Often, the first cation is a metal or metalloid cation which is $Pb^{2+}$ or $Sn^{2+}$. The first compound may comprise two or more first cations, for instance two or more cations selected from $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$.

Typically, the first precursor compound is a compound of formula $MY_2$, $MY_3$, or $MY_4$, wherein M is said first cation which is a metal or metalloid dication, trication or tetracation, and Y is said first anion.

Thus, the first precursor compound may be a compound of formula $MY_2$, wherein M is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ or $Eu^{2+}$ and Y is $F^-$, $Cl^-$, $Br^-$, $I^-$, formate or acetate. Preferably M is $Cu^{2+}$, $Pb^{2+}$, $Ge^{2+}$ or $Sn^{2+}$ and Y is $Cl^-$, $Br^-$, $I^-$, formate or acetate, preferably $Cl^-$, $Br^-$ or $I^-$.

The first precursor compound is typically a compound of formula $MX_2$. Preferably, the first precursor compound is a compound of formula $SnI_2$, $SnBr_2$, $SnCl_2$, $Pb(OAc)_2$, $PbI_2$, $PbBr_2$ or $PbCl_2$. More preferably, the first precursor compound is a compound of formula $PbI_2$, $PbBr_2$ or $PbCl_2$. Most preferably, the first precursor compound is $PbI_2$.

The first precursor compound may be a compound of formula $MY_3$, wherein M is $Bi^{3+}$ or $Sb^{3+}$ and Y is $F^-$, $Cl^-$, $Br^-$, $I^-$, $SCN^-$, $BF_4^-$, formate or acetate. Preferably M is $Bi^{3+}$ and Y is $Cl^-$, $Br^-$ or $I^-$. In that case, the A/M/X material typically comprises a bismuth or antimony halogenometallate.

The first precursor compound may be a compound of formula $MY_4$, wherein M is $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ or $Te^{4+}$ and Y is $F^-$, $Cl^-$, $Br^-$, $I^-$, $SCN^-$, $BF_4$, formate or acetate. Preferably M is $Sn^{4+}$, $Pb^{4+}$ or $Ge^{4+}$ and $Cl^-$, $Br^-$ or $I^-$. In that case, the A/M/X material typically comprises a hexahalometallate.

The concentration of the first precursor compound in the precursor composition is typically from 0.01 M to 2.0 M, for instance from 0.1 to 1.0 M.

Second Precursor Compound

The solvent system of the process of the invention is advantageously able to solubilise both a metal-containing first precursor compound and an organic material. It can also solubilise a second precursor compound which may be necessary to form the crystalline A/M/X material.

Typically, the process further comprises disposing on the substrate a second precursor compound, which second precursor compound comprises a second cation (A) and a second anion (X). Preferably, the second precursor compound is a compound of formula [A][X] wherein: [A] comprises the one or more second cations; and [X] comprises one or more halide anions. Often, the precursor composition further comprises: (c) a second precursor compound, which second precursor compound comprises a second cation (A) and a second anion (X).

The second precursor compound comprises a second anion (e.g. a halide anion) and a second cation. The second anion and second cation may be any suitable ions. For instance, the second cation may be a metal or metalloid cation or an organic cation. The second cation is typically a cation selected from $Li^+$, $Na^+$, $K^+$, $Rb^+$, $Cs^+$ and an organic cation. The second cation is often a monocation, for instance a metal or metalloid monocation or an organic monocation. Typically, wherein the second cation is $Cs^+$ or an organic cation.

Typically, the second cation is an organic cation. The second cation may be any suitable organic cation. The organic cation may be a cation derived from an organic compound, for instance by protonation. The second cation may be an organic monocation or an organic dication. The second cation is typically an organic monocation. The second cation typically has a molecular weight of less than or equal to 500 $gmol^{-1}$. Preferably, the second cation has a molecular weight of less than or equal to 250 $gmol^{-1}$ or less than or equal to 150 $gmol^{-1}$. Often, the second cation is an organic cation comprising a nitrogen atom or a phosphorous atom. For instance, the organic cation may comprise a quaternary nitrogen atom.

Typically, the second cation is $Cs^+$, $(NR^1R^2R^3R^4)^+$, $(R^1R^2N{=}CR^3R^4)^+$, $(R^1R^2N{-}C(R^5){=}NR^3R^4)^+$ or $(R^1R^2N{-}C(NR^5R^6){=}NR^3R^4)^+$, and each of $R^1$, $R^2$, $R^3$, $R^4$, $R^5$ and $R^6$ is independently H, a substituted or unsubstituted $C_{1-20}$ alkyl group or a substituted or unsubstituted aryl group. $R^1$, $R^2$, $R^3$, $R^4$, $R^5$ and $R^6$ are typically independently H, a substituted or unsubstituted $C_{1-6}$ alkyl group or a substituted or unsubstituted aryl group. Preferably $R^1$, $R^2$, $R^3$, $R^4$, $R^5$ and $R^6$ are independently H, or an unsubstituted $C_{1-6}$ alkyl group. For instance, $R^1$, $R^2$, $R^3$, $R^4$, $R^5$ and $R^6$ may independently be H, methyl, ethyl or propyl.

Preferably, the second cation is selected from $(R^1NH_3)^+$, $(NR^2{}_4)^+$, and $(H_2N{-}C(R'){=}NH_2)^+$, wherein $R^1$ is H, a substituted or unsubstituted $C_{1-20}$ alkyl group or a substituted or unsubstituted aryl group, and each $R^2$ is independently H, or a substituted or unsubstituted $C_{1-10}$ alkyl group. Often, $R^1$ is H or an unsubstituted $C_{1-6}$ alkyl group and each $R^2$ is an unsubstituted $C_{1-6}$ alkyl group. For instance, $R^1$ may be H, methyl, ethyl or propyl and each $R^2$ may be methyl, ethyl and propyl. All $R^2$ may be the same and may be methyl, ethyl and propyl. For instance, the second cation may be selected from $Cs^+$, $(CH_3NH_3)^+$, $(CH_3CH_2NH_3)^+$, $(CH_3CH_2CH_2NH_3)^+$, $(N(CH_3)_4)^+$, $(N(CH_2CH_3)_4)^+$, $(N(CH_2CH_2CH_3)_4)^+$, $(H_2N{-}C(H){=}NH_2)^+$ and $(H_2N{-}C(CH_3){=}NH_2)^+$. Preferably, the one or more second cations are selected from $(CH_3NH_3)^+$, $(H_2N{-}C(H){=}NH_2)^+$ and $Cs^+$.

The second anion is typically a halide anion. The second anion may be $F^-$, $Cl^-$, $Br^-$ or $I^-$. Often, the second anion is $Cl^-$, $Br^-$ or $I^-$.

Typically, the one or more first cations are selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ or $Te^{4+}$, preferably wherein the one or more first cations are selected from $Cu^{2+}$, $Pb^{2+}$, $Ge^{2+}$ and $Sn^{2+}$; and the one or more second cations are selected from cations of formula $Cs^+$, $(NR^1R^2R^3R^4)^+$, $(R^1R^2N{=}CR^3R^4)^+$, $(R^1R^2N{-}C(R^5){=}NR^3R^4)^+$ and $(R^1R^2N{-}C(NR^5R^6){=}NR^3R^4)^+$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group, preferably wherein the one or more second cations are selected from $(CH_3NH_3)^+$ and $(H_2N{-}C(H){=}NH_2)^+$.

The second precursor compound is a typically compound of formula AX. The second precursor compound may, for instance, be selected from $(H_3NR^1)X$, $(NR^1R^2R^3R^4)X$, $(R^1R^2N{=}CR^3R^4)X$, $(R^1R^2N{-}C(R^5){=}NR^3R^4)X$ and $(R^1R^2N{-}C(NR^5R^6){=}NR^3R^4)X$, wherein each of $R^1$, $R^2$, $R^3$, $R^4$, $R^5$ and $R^6$ is independently H, a substituted or unsubstituted $C_{1-20}$ alkyl group or a substituted or unsubstituted aryl group, and X is $F^-$, $Cl^-$, $Br^-$, or $I^-$. Preferably the second precursor compound is $(H_3NR^1)X$, wherein $R^1$ is an unsubstituted $C_{1-6}$ alkyl group and X is $Cl^-$, $Br^-$, or $I^-$.

The second precursor compound may, for example, be selected from CsF, CsCl, CsBr, CsI, $NH_4F$, $NH_4Cl$, $NH_4Br$, $NH_4I$, $(CH_3NH_3)F$, $(CH_3NH_3)Cl$, $(CH_3NH_3)Br$, $(CH_3NH_3)I$, $(CH_3CH_2NH_3)F$, $(CH_3CH_2NH_3)Cl$, $(CH_3CH_2NH_3)Br$, $(CH_3CH_2NH_3)I$, $(N(CH_3)_4)F$, $(N(CH_3)_4)Cl$, $(N(CH_3)_4)Br$, $(N(CH_3)_4)I$, $(H_2N{-}C(H){=}NH_2)F$, $(H_2N{-}C(H){=}NH_2)Cl$, $(H_2N{-}C(H){=}NH_2)Br$ and $(H_2N{-}C(H){=}NH_2)I$. Typically, the second precursor compound is selected from $(CH_3NH_3)Cl$, $(CH_3NH_3)Br$, $(CH_3NH_3)I$, $(CH_3CH_2NH_3)Cl$, $(CH_3CH_2NH_3)Br$, $(CH_3CH_2NH_3)I$, $(N(CH_3)_4)Cl$, $(N(CH_3)_4)Br$, $(N(CH_3)_4)I$, $(H_2N{-}C(H){=}NH_2)Cl$, $(H_2N{-}C(H){=}NH_2)Br$ and $(H_2N{-}C(H){=}NH_2)I$.

Preferably, the second precursor compound is $(H_2N{-}C(H){=}NH_2)I$, $(H_2N{-}C(H){=}NH_2)Br$, $(H_2N{-}C(H){=}NH_2)Cl$, $(CH_3NH_3)I$, $(CH_3NH_3)Br$ or $(CH_3NH_3)Cl$. For instance, the second precursor compound may be $(CH_3NH_3)I$.

If the crystalline A/M/X material is a mixed cation material, it may contain 2 or more different second precursor compounds. For instance, the precursor composition may comprise CsX and $(H_2N{-}C(H){=}NH_2)X'$, where X and X' are the same or different and are halide anions selected from $Cl^-$, $Br^-$ and $I^-$.

Typically, the molar ratio (first precursor compound):(second precursor compound) in the precursor composition is from 1:2 to 2:1.

Organic Material

An advantage of the process of the present invention is that allows for simultaneous deposition of an A/M/X material and an organic material. Accordingly, the precursor composition typically further comprises: (d) an organic material.

The organic material is typically an organic dielectric material, an organic semiconducting material, an organic polymer, a fullerene derivative, an organic reducing agent or an organic oxidizing agent.

The organic semiconducting material is typically selected from poly(4-butylphenyldiphenylamine), poly(N,N'-bis-4-butylphenyl-N,N'-bisphenyl)benzidine (polyTPD), a poly (triarylamine) (PTAA), a spiro-bi-fluorene compound, spiro-OMeTAD, a polymer comprising thiophene, poly(3-hexyl thiophene), poly(3,4-ethylenedioxythiophene) (PEDOT), a rylene derivative, perylene, poly[(9,9-dioctylfluorenyl-2,7-diyl)-co-(4,4'-(N-(4-sec-butylphenyl) diphenylamine)] (TFB), poly(9,9-dioctylfluorenyl-2,7-diyl) (F8), poly(9-vinylcarbazole) (PVK), 4,4'-Bis(carbazol-9-yl)biphenyl (CBP), poly[(9,9-dioctylfluorenyl-2,7-diyl)-alt-(benzo[2,1,3]thiadiazol-4,7-diyl)] (F8BT), poly(3-hexylthiophene-2,5-diyl) (P3HT), phenyl-C61-butyric acid methyl ester (PCBM) and diphenylanthracene (DPA).

The organic dielectric material is typically selected from poly(methylmethacrylate) (PMMA), polystyrene, poly(vinyl acetate) and ethylene-vinyl acetate (EVA).

The organic reducing agent or an organic oxidizing agent is typically selected from 2,3,5,6-tetrafluoro-7,7,8,8-tetracyanoquinodimethane (F4TCNQ), hexafluorotetra-cyanonaphthoquinodimethane (F6TCNNQ), a molybdenum compound, molybdenum tris(dithiolene), pentamethylcyclopentadienyl cyclopentadienyl rhodium dimer, decamethylcobaltocene (DMC), 3-dimethyl-2-phenyl-2,3-dihydro-1H-benzoimidazole (N-DMBI), pentamethyliridocene ($(IrCp^*Cp)_2$) and ruthenium pentamethylcyclopentadienyl mesitylene ($(RuCp^*mes)_2$).

Preferably, the organic material is polymethyl methacrylate or phenyl-C61-butyric acid methyl ester (PCBM). More preferably, the organic material is phenyl-C61-butyric acid methyl ester.

The concentration of the organic material in the precursor composition is typically less than 30 mg/ml, for instance less than 20 mg/ml.

Second Alkylamine

The presence of the first organic amine (e.g. the first alkylamine) creates a solvent system which is able to dissolve both a metal-containing first precursor compound and an organic material. However, it is often desirable to further include a second alkylamine. Organic amines such as alkylamines which are present in the solvent in the precursor composition are often incorporated in the structure of the crystalline A/M/X material. If this is undesirable, the invention also provides for exposure of the layer produced from the disposed precursor composition to a conversion compound as described below. Alternatively (or additionally), the precursor compound may comprise a second alkylamine, the presence of which in the as-produced A/M/X material is preferred.

Accordingly, the solvent typically further comprises a second alkylamine. The second alkylamine is typically a compound of formula $R^BNH_2$, wherein $R^B$ an unsubstituted $C_{1-8}$ alkyl group.

As mentioned above, the second alkylamine is often preferentially incorporated into the A/M/X material. Accordingly, [A] in the formula of the A/M/X material typically comprises a second cation which is a cation of formula $(R^BNH_3)^+$ and the second alkylamine is a compound of formula $R^BNH_2$, wherein each $R^B$ is the same group, which is a $C_{1-8}$ alkyl group. For instance, the second alkylamine may be methylamine or ethylamine.

Preferably, the second cation is methylammonium and the second alkylamine is methylamine.

When the solvent comprises a second alkylamine, the solvent is typically produced by adding the second alkylamine to the non-polar solvent before or after addition of the first alkylamine to the non-polar organic solvent. The second alkylamine may be added to the non-polar organic solvent by bubbling the second alkylamine through the non-polar solvent, for instance for from 1 to 30 minutes. The solvent may be obtainable by bubbling the second alkylamine through the non-polar solvent.

The amount of second alkylamine in the solvent or precursor composition may vary depending on requirements. Typically, when present, the molar ratio of (the second alkylamine):(the first precursor compound) is from $1\times10^{-7}$:1 to 0.5:1, optionally from $1\times10^{-6}$:1 to 0.1:1. In some cases, the amount of the second alkylamine may be relatively small. For instance, the molar ratio of (the second alkylamine):(the first precursor compound) may be less than $1\times10^{-4}$:1. In this case, the molar ratio may for instance be from $1\times10^{-7}$:1.

The solvent may accordingly comprise toluene as the non-polar organic solvent, butylamine as the first organic amine and methylamine as the second alkylamine. For instance, the solvent may be obtainable by bubbling methylamine gas through the non-polar organic solvent for from 1 to 30 minutes and then mixing in butylamine, for instance in a volume of from 50 μl to 300 μl per ml of the non-polar organic solvent.

Crystalline A/M/X Material

The crystalline A/M/X material may be any suitable crystalline A/M/X material. The crystalline compound may comprise a compound having the following formula $[A]_a[M]_b[X]_c$ wherein: [A] is one or more second cations; [M] is one or more first cations which are metal or metalloid cations selected from $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$, $Te^{4+}$, $Bi^{3+}$, $Sb^{3+}$, $Sn^{2+}$, $Pb^{2+}$, $Cu^{2+}$, $Ge^{2+}$ and $Ni^{2+}$; [X] is one or more second anions selected from $Cl^-$, $Br^-$, $I^-$, $O^{2-}$, $S^{2-}$, $Se^{2-}$, and $Te^{2-}$; a is an integer from 1 to 3; b is an integer from 1 to 3; and c is an integer from 1 to 8.

If [A] is one cation (A), [M] is two cations ($M^1$ and $M^2$), and [X] is one anion (X), the crystalline material may comprise a compound of formula $A_a(M^1,M^2)_bX_c$. [A] may represent one, two or more A ions. If [A], [M] or [X] is more than one ion, those ions may be present in any proportion. For instance, $A_a(M^1,M^2)_bX_c$ includes all compounds of formula $A^aM^1_{by}M^2_{b(1-y)}X_c$ wherein y is between 0 and 1, for instance from 0.05 to 0.95. Such materials may be referred to as mixed ion materials.

Typically, the crystalline A/M/X material comprises a perovskite or a hexahalometallate. Preferably the crystalline material comprises a perovskite. The crystalline material often comprises a metal halide perovskite. The crystalline material often comprises an organometal halide perovskite.

The crystalline A/M/X material may comprise a perovskite with a mixture of 3D and 2D phases, and which comprises a mixture of small and large organic cations, such as butylammonium and methylammonium, or butylammonium and formamidinium.

Preferably, the crystalline A/M/X material comprises a perovskite compound of formula $[A][M][X]_3$, wherein: [A] comprises the one or more second cations; [M] comprises the one or more first cations; and [X] comprises the one or more halide anion. The one or more first cations and one or more second cations may be as described herein.

For instance, the crystalline A/M/X material may comprise a perovskite compound of formula $[A][M][X]_3$, wherein: [A] comprises one or more second cations selected from $Cs^+$, $(CH_3NH_3)^+$, $(H_2N{-}C(H){=}NH_2)^+$ and $(CH_3(CH_2)_3NH_3)^+$; [M] comprises the one or more first cations selected from $Pb^{2+}$ and $Sn^{2+}$; and [X] comprises the one or more halide anion.

In one embodiment, the perovskite is a perovskite compound of the formula (IA):

$$AM[X]_3 \quad (IA)$$

wherein: A is an organic monocation; M is a metal cation; and [X] is two or more different halide anions. [X] may be two or three different halide anions.

In one embodiment, the perovskite is a perovskite compound of formula:

$$Cs_z(H_2N—C(H)═NH_2)_{(1-z)}[B]X_{3y}X'_{3(1-y)}$$

wherein: [B] is the one or more first cations; X is a first halide anion selected from $I^-$, $Br^-$, $Cl^-$ and $F^-$; X' is a second halide anion which is different from the first halide anion and is selected from $I^-$, $Br^-$, $Cl^-$ and $F^-$; z is from 0.01 to 0.99; and y is from 0.01 to 0.99. For instance, the perovskite may be a compound of formula $Cs_z(H_2N—C(H)═NH_2)_{(1-z)}PbBr_{3y}I_{3(1-y)}$.

The crystalline A/M/X material may comprise: a perovskite compound of formula $CH_3NH_3PbI_3$, $CH_3NH_3PbBr_3$, $CH_3NH_3PbCl_3$, $CH_3NH_3PbF_3$, $CH_3NH_3PbBr_xI_{3-x}$, $CH_3NH_3PbBr_xCl_{3-x}$, $CH_3NH_3PbI_xCl_{3-x}$, $CH_3NH_3PbI_{3-x}Cl_x$, $CH_3NH_3SnI_3$, $CH_3NH_3SnBr_3$, $CH_3NH_3SnCl_3$, $CH_3NH_3SnF_3$, $CH_3NH_3SnBrI_2$, $CH_3NH_3SnBr_xI_{3-x}$, $CH_3NH_3SnBr_xCl_{3-x}$, $CH_3NH_3SnF_{3-x}Br_x$, $CH_3NH_3SnI_xBr_{3-x}$, $CH_3NH_3SnI_xCl_{3-x}$, $CH_3NH_3SnF_{3-x}I_x$, $CH_3NH_3SnCl_xBr_{3-x}$, $CH_3NH_3SnI_{3-x}Cl_x$ and $CH_3NH_3SnF_{3-x}Cl_x$, $CH_3NH_3CuI_3$, $CH_3NH_3CuBr_3$, $CH_3NH_3CuCl_3$, $CH_3NH_3CuF_3$, $CH_3NH_3CuBrI_2$, $CH_3NH_3CuBrxI_{3-x}$, $CH_3NH_3CuBr_xCl_{3-x}$, $CH_3NH_3CuF_{3-x}Br_x$, $CH_3NH_3CuI_xBr_{3-x}$, $CH_3NH_3CuI_xCl_{3-x}$, $CH_3NH_3CuF_{3-x}I_x$, $CH_3NH_3CuCl_xBr_{3-x}$, $CH_3NH_3CuI_{3-x}Cl_x$, or $CH_3NH_3CuF_{3-x}Cl_x$ where x is from 0 to 3; a perovskite compound of formula $(H_2N—C(H)═NH_2)PbI_3$, $(H_2N—C(H)═NH_2)PbBr_3$, $(H_2N—C(H)═NH_2)(H_2N—C(H)═NH_2)PbCl_3$, $(H_2N—C(H)═NH_2)PbF_3$, $(H_2N—C(H)═NH_2)PbBr_xI_{3-x}$, $(H_2N—C(H)═NH_2)PbBr_xCl_{3-x}$, $(H_2N—C(H)═NH_2)PbI_xBr_{3-x}$, $(H_2N—C(H)═NH_2)PbI_xCl_{3-x}$, $(H_2N—C(H)═NH_2)PbCl_xBr_{3-x}$, $(H_2N—C(H)═NH_2)PbI_{3-x}Cl_x$, $(H_2N—C(H)═NH_2)SnI_3$, $(H_2N—C(H)═NH_2)SnBr_3$, $(H_2N—C(H)═NH_2)SnCl_3$, $(H_2N—C(H)═NH_2)SnF_3$, $(H_2N—C(H)═NH_2)SnBrI_2$, $(H_2N—C(H)═NH_2)SnBr_xI_{3-x}$, $(H_2N—C(H)═NH_2)SnBr_xCl_{3-x}$, $(H_2N—C(H)═NH_2)SnF_{3-x}Br_x$, $(H_2N—C(H)═NH_2)SnI_xBr_{3-x}$, $(H_2N—C(H)═NH_2)SnI_xCl_{3-x}$, $(H_2N—C(H)═NH_2)SnF_{3-x}I_x$, $(H_2N—C(H)═NH_2)SnCl_xBr_{3-x}$, $(H_2N—C(H)═NH_2)SnI_{3-x}Cl_x$, $(H_2N—C(H)═NH_2)SnF_{3-x}Cl_x$, $(H_2N—C(H)═NH_2)CuI_3$, $(H_2N—C(H)═NH_2)CuBr_3$, $(H_2N—C(H)═NH_2)CuCl_3$, $(H_2N—C(H)═NH_2)CuF_3$, $(H_2N—C(H)═NH_2)CuBrI_2$, $(H_2N—C(H)═NH_2)CuBr_xI_{3-x}$, $(H_2N—C(H)═NH_2)CuBr_xCl_{3-x}$, $(H_2N—C(H)═NH_2)CuF_{3-x}Br_x$, $(H_2N—C(H)═NH_2)CuI_xBr_{3-x}$, $(H_2N—C(H)═NH_2)CuI_xCl_{3-x}$, $(H_2N—C(H)═NH_2)CuF_{3-x}I_x$, $(H_2N—C(H)═NH_2)CuCl_xBr_{3-x}$, $(H_2N—C(H)═NH_2)CuI_{3-x}Cl_x$, or $(H_2N—C(H)═NH_2)CuF_{3-x}Cl_x$ where x is from 0 to 3; or a perovskite compound of formula $(H_2N—C(H)═NH_2)_yCs_{1-y}PbI_3$, $(H_2N—C(H)═NH_2)_yCs_{1-y}PbBr_3$, $(H_2N—C(H)═NH_2)_yCs_{1-y}PbCl_3$, $(H_2N—C(H)═NH_2)_yCs_{1-y}PbF_3$, $(H_2N—C(H)═NH_2)_yCs_{1-y}PbBr_xI_{3-x}$, $(H_2N—C(H)═NH_2)_yCs_{1-y}PbBr_xCl_{3-x}$, $(H_2N—C(H)═NH_2)_yCs_{1-y}PbI_xBr_{3-x}$, $(H_2N—C(H)═NH_2)_yCs_{1-y}PbI_xCl_{3-x}$, $(H_2N—C(H)═NH_2)_yCs_{1-y}PbCl_xBr_{3-x}$, $(H_2N—C(H)═NH_2)_yCs_{1-y}PbI_{3-x}Cl_x$, $(H_2N—C(H)═NH_2)_yCs_{1-y}SnI_3$, $(H_2N—C(H)═NH_2)_yCs_{1-y}SnBr_3$, $(H_2N—C(H)═NH_2)_yCs_{1-y}SnCl_3$, $(H_2N—C(H)═NH_2)_yCs_{1-y}SnF_3$, $(H_2N—C(H)═NH_2)_yCs_{1-y}SnBrI_2$, $(H_2N—C(H)═NH_2)_yCs_{1-y}SnBr_xI_{3-x}$, $(H_2N—C(H)═NH_2)_yCs_{1-y}SnBr_xCl_{3-x}$, $(H_2N—C(H)═NH_2)_yCs_{1-y}SnF_{3-x}Br_x$, $(H_2N—C(H)═NH_2)_yCs_{1-y}SnI_xBr_{3-x}$, $(H_2N—C(H)═NH_2)_yCs_{1-y}SnI_xCl_{3-x}$, $(H_2N—C(H)═NH_2)_yCs_{1-y}SnF_{3-x}I_x$, $(H_2N—C(H)═NH_2)_yCs_{1-y}SnCl_xBr_{3-x}$, $(H_2N—C(H)═NH_2)_yCs_{1-y}SnI_{3-x}Cl_x$, $(H_2N—C(H)═NH_2)_yCs_{1-y}SnF_{3-x}Cl_x$, $(H_2N—C(H)═NH_2)_yCs_{1-y}CuI_3$, $(H_2N—C(H)═NH_2)_yCs_{1-y}CuBr_3$, $(H_2N—C(H)═NH_2)_yCs_{1-y}CuCl_3$, $(H_2N—C(H)═NH_2)_yCs_{1-y}CuF_3$, $(H_2N—C(H)═NH_2)_yCs_{1-y}CuBrI_2$, $(H_2N—C(H)═NH_2)_yCs_{1-y}CuBr_xI_{3-x}$, $(H_2N—C(H)═NH_2)_yCs_{1-y}CuBr_xCl_{3-x}$, $(H_2N—C(H)═NH_2)_yCs_{1-y}CuF_{3-x}Br_x$, $(H_2N—C(H)═NH_2)_yCs_{1-y}CuI_xBr_{3-x}$, $(H_2N—C(H)═NH_2)_yCs_{1-y}CuI_xCl_{3-x}$, $(H_2N—C(H)═NH_2)_yCs_{1-y}CuF_{3-x}I_x$, $(H_2N—C(H)═NH_2)_yCs_{1-y}CuCl_xBr_{3-x}$, $(H_2N—C(H)═NH_2)_yCs_{1-y}CuI_{3-x}Cl_x$, or $(H_2N—C(H)═NH_2)_yCs_{1-y}CuF_{3-x}Cl_x$ where x is from 0 to 3 and y is from 0.1 to 0.9.

Typically, the crystalline A/M/X material is a perovskite of formula $CH_3NH_3PbI_3$, $CH_3NH_3PbBr_3$, $CH_3NH_3PbCl_3$, $CH_3NH_3PbBr_xCl_{3-x}$, $CH_3NH_3PbI_xBr_{3-x}$, $CH_3NH_3PbI_xCl_{3-x}$ where x is from 0 to 3, for instance from 0.1 to 2.99.

The crystalline A/M/X material may comprise a perovskite compound of $A_{n-1}A'_2M_n[X]_{3n+1}$ wherein: A and A' are different second cations; M is a first cation; [X] is at least one halide anion and n is an integer from 1 to 8, for instance from 2 to 6. n may be 3 or 4. A may for instance be methylammonium $(CH_3NH_3)^+$. A' may for instance be butylammonium $(CH_3(CH_2)_3NH_3)^+$. M may for instance be $Pb^{2+}$. X may for instance be one or more of $I^-$, $Br^-$ or $Cl^-$.

The crystalline A/M/X material may for instance alternatively comprise a hexahalometallate of formula (III):

$$[A]_2[M][X]_6 \quad (III)$$

wherein: [A] is the one or more second cations; [M] is the one or more first cations which are one or more metal or metalloid tetracations; and [X] is at least one halide anion.

For instance, the hexahalometallate compound may be $Cs_2SnI_6$, $Cs_2SnBr_6$, $Cs_2SnBr_{6-y}I_y$, $Cs_2SnCl_{6-y}I_y$, $Cs_2SnCl_{6-y}Br_y$, $(CH_3NH_3)_2SnI_6$, $(CH_3NH_3)_2SnBr_6$, $(CH_3NH_3)_2SnBr_{6-y}I_y$, $(CH_3NH_3)_2SnCl_{6-y}I_y$, $(CH_3NH_3)_2SnCl_{6-y}Br_y$, $(H_2N—C(H)═NH_2)_2SnI_6$, $(H_2N—C(H)═NH_2)_2SnBr_6$, $(H_2N—C(H)═NH_2)_2SnBr_{6-y}I_y$, $(H_2N—C(H)═NH_2)_2SnCl_{6-y}I_y$ or $(H_2N—C(H)═NH_2)_2SnCl_{6-y}Br_y$ wherein y is from 0.01 to 5.99.

The crystalline A/M/X material may comprise a double perovskite compound of formula of formula $[A]_2[B^I][B^{III}][X]_6$ wherein: [A] is the one or more first monocations; $[B^I]$ is one or more second monocations; $[B^{III}]$ is one or more trications; and [X] is the one or more halide anions. $B^I$ and $B^{III}$ may be as defined above for M. $[B^I]$ may be selected from $Li^+$, $Na^+$, $K^+$, $Rb^+$, $Cs^+$, $Cu^+$, $Ag^+$, $Au^+$ and $Hg^+$, preferably from $Cu^+$, $Ag^+$ and $Au^+$. $[B^{III}]$ may be selected from $Bi^{3+}$, $Sb^{3+}$, $Cr^{3+}$, $Fe^{3+}$, $Co^{3+}$, $Ga^{3+}$, $As^{3+}$, $Ru^{3+}$, $Rh^{3+}$, $In^{3+}$, $Fr^{3+}$ and $Au^{3+}$, preferably from $Bi^{3+}$ and $Sb^{3+}$. The double perovskite may be a compound of formula $Cs_2AgBiX_6$, $(H_2N—C(H)═NH_2)_2AgBiX_6$, $(H_2N—C(H)═NH_2)_2AuBiX_6$, $(CH_3NH_3)_2AgBiX_6$ or $(CH_3NH_3)_2AuBiX_6$ where X is $I^-$, $Br^-$ or $Cl^-$. The double perovskite may be a compound of formula $Cs_2AgBiBr_6$.

Process Conditions

The final concentration of the precursor compounds in the precursor composition comprising the precursor compounds and solvent is typically from 10 to 60 wt %. The concentration may be from 20 to 50 wt % or from 15 to 35 wt %, for instance about 30 wt %. Percentages are relative to the total weight of the precursor composition.

Typically, the precursor composition is disposed on the substrate by solution phase deposition, for instance graveur coating, slot dye coating, screen printing, ink jet printing, doctor blade coating, spray coating or spin-coating. Typically the precursor composition is disposed on the substrate by spin-coating the precursor composition on the substrate.

Usually, the layer of the crystalline A/M/X material has a thickness of from 5 to 3000 nm. Typically, the layer has a thickness of from 20 to 1000 nm, for instance from 100 to 1000 nm or from 300 to 1000 nm. Preferably, the layer has a thickness of greater than or equal to 100 nm, for instance from 100 to 3000 nm or from 100 to 700 nm.

Typically, the process further comprises removing the solvent to form the layer comprising the perovskite compound. Removing the solvent may comprise heating the substrate, or allowing the solvent to evaporate.

Often, it is desirable to anneal the layer of the crystalline A/M/X material or the layer of the disposed precursor composition. Typically, the process further comprises heating the substrate with the precursor composition disposed thereon. Preferably, the substrate is heated to a temperature of from 50° C. to 400° C., for instance from 50° C. to 200° C. More preferably, the substrate is heated to a temperature of from 50° C. to 200° C. for a time of from 1 to 100 minutes.

The process may comprise disposing on a substrate a precursor composition comprising: (a) $PbI_2$; (b) a solvent which comprises toluene and butylamine; and (c) $(CH_3NH_3)I$. Preferably, the process comprises disposing on a substrate a precursor composition comprising: (a) $PbI_2$; (b) a solvent which comprises toluene, butylamine and methylamine; and (c) $(CH_3NH_3)I$.

The substrate typically comprises a layer of a first electrode material. The first electrode material may comprise a metal (for instance silver, gold, aluminium or tungsten) or a transparent conducting oxide (for instance fluorine doped tin oxide (FTO) or indium doped tin oxide (ITO)). Typically, the first electrode comprise a transparent conducting oxide.

The substrate may, for instance, comprise a layer of a first electrode material and a layer of an n-type semiconductor. Often, the substrate comprises a layer of a transparent conducting oxide, for instance FTO, and a compact layer of an n-type semiconductor, for instance $TiO_2$.

In some embodiments, the substrate comprises a layer of a porous scaffold material. The layer of a porous scaffold is usually in contact with a layer of an n-type or p-type semiconductor material, for instance a compact layer of an n-type semiconductor or a compact layer of a p-type semiconductor. The scaffold material is typically mesoporous or macroporous. The scaffold material may aid charge transport from the crystalline material to an adjacent region. The scaffold material may also aid formation of the layer of the crystalline material during deposition. The porous scaffold material is typically infiltrated by the crystalline material after deposition.

Typically, the porous scaffold material comprises a dielectric material or a charge-transporting material. The scaffold material may be a dielectric scaffold material. The scaffold material may be a charge-transporting scaffold material. The porous scaffold material may be an electron-transporting material or a hole-transporting scaffold material. n-type semiconductors are examples of electron-transporting materials. p-type semiconductors are examples of hole-transporting scaffold materials. Preferably, the porous scaffold material is a dielectric scaffold material or a electron-transporting scaffold material (e.g. an n-type scaffold material).

The porous scaffold material may be a charge-transporting scaffold material (e.g. an electron-transporting material such as titania, or alternatively a hole transporting material) or a dielectric material, such as alumina. The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV. (The band gap of titania is about 3.2 eV.) The skilled person of course is readily able to measure the band gap of a material by using well-known procedures which do not require undue experimentation. For instance, the band gap of a material can be estimated by constructing a photovoltaic diode or solar cell from the material and determining the photovoltaic action spectrum. The monochromatic photon energy at which the photocurrent starts to be generated by the diode can be taken as the band gap of the material; such a method was used by Barkhouse et al., Prog. Photovolt: Res. Appl. 2012; 20:6-11. References herein to the band gap of a material mean the band gap as measured by this method, i.e. the band gap as determined by recording the photovoltaic action spectrum of a photovoltaic diode or solar cell constructed from the material and observing the monochromatic photon energy at which significant photocurrent starts to be generated.

The thickness of the layer of the porous scaffold is typically from 5 nm to 400 nm. For instance, the thickness of the layer of the porous scaffold may be from 10 nm to 50 nm.

The substrate may, for instance, comprise a layer of a first electrode material, a layer of an n-type semiconductor, and a layer of a dielectric scaffold material. The substrate may therefore comprise a layer of a transparent conducting oxide, a compact layer of $TiO_2$ and a porous layer of $Al_2O_3$.

Often, the substrate comprises a layer of a first electrode material and a layer of an n-type semiconductor or a layer of a p-type semiconductor.

Typically, the substrate comprises a layer of a first electrode material and optionally one or more additional layers that are each selected from: a layer of an n-type semiconductor, a layer of a p-type semiconductor, and a layer of insulating material. Typically, a surface of the substrate on which the precursor composition is disposed comprises one or more of a first electrode material, a layer of an n-type semiconductor, a layer of a p-type semiconductor, and a layer of insulating material.

The p-type semiconductor may comprise an inorganic or an organic p-type semiconductor. Typically, the p-type semiconductor comprises an organic p-type semiconductor. Suitable p-type semiconductors may be selected from polymeric or molecular hole transporters. The p-type semiconductor may comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b'] dithiophene-2,6-diyl]]) or PVK (poly(N-vinylcarbazole)). The p-type semiconductor may comprise carbon nanotubes. Usually, the p-type semiconductor is selected from spiro-OMeTAD, P3HT, PCPDTBT and PVK. Preferably, the p-type semiconductor is spiro-OMeTAD.

Additional Process Steps

The process may comprise an additional step in which any of the first organic amine incorporated into the layer produced by disposing the precursor compound on the substrate is removed by exposing the disposed layer to a conversion compound (i.e. a compound which converts the as-disposed layer into the desired crystalline A/M/X material). Accordingly, the process typically further comprises a step of exposing the substrate with the precursor composition disposed thereon to a conversion compound, which conversion compound is a compound of formula $R^CNH_2$ or $(R^CNH_3)X$ wherein $R^C$ is a $C_{1-4}$ alkyl group and X is a halide anion. For instance, the conversion compound may be selected from methylamine, ethylamine, propylamine, a methylammonium halide, an ethylammonium halide or propylammonium halide (where the halide is selected from iodide, bromide and chloride). Alternatively, the conversion compound may be a formamidinium halide, for instance $(H_2N—C(H)=NH_2)Cl$, $(H_2N—C(H)=NH_2)Br$ or $(H_2N—C(H)=NH_2)I$.

The conversion compound typically corresponds to the compound obtained by deprotonating the second cation (i.e. the A cation) which is present in the crystalline A/M/X compound. For instance, if the A/M/X compound comprises methylammonium as one of the one or more second cations, the conversion compound may be methylamine. Preferably, the conversion compound is methylamine or a methylammonium halide.

Exposing the substrate with the precursor composition disposed thereon to a conversion compound typically comprises exposing the substrate with the precursor composition disposed thereon to vapour comprising the conversion compound. The process may further comprise a step of annealing the as-disposed precursor composition between deposition of the precursor compound on the substrate and exposure of the substrate to the conversion compound. The annealing may comprise heating the substrate with the precursor composition disposed thereon at a temperature of from 50° C. to 200° C. for a time of from 1 to 100 minutes.

Exposing the substrate with the precursor composition disposed thereon to vapour comprising the conversion compound typically comprises exposing the substrate with the precursor composition disposed thereon to vapour comprising the conversion compound at a pressure of at least 500 mbar. The exposure may be conducted at atmospheric pressure.

The substrate may be exposed to the conversion compound for at least 1 second, for instance from 5 to 600 seconds. Typically the substrate is exposed to the conversion compound at ambient temperature (for instance from 15 to 25° C.).

Process for Producing a Device

The invention also provides a process for producing a semiconductor device comprising a layer of a crystalline A/M/X material, which process comprises producing said layer of a crystalline A/M/X material by a process as defined herein.

The process typically further comprises disposing on the layer of a crystalline A/M/X material a layer of a p-type semiconductor or a layer of a n-type semiconductor. Often, the process typically comprises disposing on the layer of a crystalline material a layer of a p-type semiconductor. The n-type or p-type semiconductor may be as defined herein. For instance, the p-type semiconductor may be an organic p-type semiconductor. Suitable p-type semiconductors may be selected from polymeric or molecular hole transporters. Preferably, the p-type semiconductor is spiro-OMeTAD. The layer of a p-type semiconductor or a layer of a n-type semiconductor is typically disposed on the layer of the crystalline material by solution-processing, for instance by disposing a composition comprising a solvent and the n-type or p-type semiconductor. The solvent may be selected from polar solvents, for instance chlorobenzene or acetonitrile. The thickness of the layer of the p-type semiconductor or the layer of the n-type semiconductor is typically from 50 nm to 500 nm.

The process typically further comprises disposing on the layer of the p-type semiconductor or n-type semiconductor a layer of a second electrode material. The second electrode material may be as defined above for the first electrode material. Typically, the second electrode material comprises, or consists essentially of, a metal. Examples of metals which the second electrode material may comprise, or consist essentially of, include silver, gold, copper, aluminium, platinum, palladium, or tungsten. The second electrode may be disposed by vacuum evaporation. The thickness of the layer of a second electrode material is typically from 5 nm to 100 nm.

Typically, the semiconductor device is an optoelectronic device, a photovoltaic device, a solar cell, a photo detector, a photodiode, a photosensor (photodetector), a radiation detector, a chromogenic device, a transistor, a diode, a light-sensitive transistor, a phototransistor, a solid state triode, a battery, a battery electrode, a capacitor, a super-capacitor, a light-emitting device, a light-emitting diode or a laser.

The semiconductor device is typically an optoelectronic device. Examples of optoelectronic devices include photovoltaic devices, photodiodes (including solar cells), phototransistors, photomultipliers, photoresistors, and light emitting devices. Preferably, the semiconductor device is a photovoltaic device.

Composition

The present invention also provides a composition comprising: (i) a compound of formula $MX_n$, wherein: M is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ or $Te^{4+}$, preferably $Cu^{2+}$, $Pb^{2+}$, $Ge^{2+}$ or $Sn^{2+}$; X is $I^-$, $Br^-$, $Cl^-$ or $F^-$; and n is 2, 3 or 4; (ii) a compound of formula AX, wherein A is $(R^1NH_3)^+$, $(NR^2_4)^+$ and $(H_2N—C(R')=NH_2)^+$, wherein $R^1$ is H or an unsubstituted $C_{1-6}$ alkyl group and each $R^2$ is an unsubstituted $C_{1-6}$ alkyl group, and X is $I^-$, $Br^-$, $Cl^-$ or $F^-$; (iii) a non-polar organic solvent which is a hydrocarbon solvent, a chlorohydrocarbon solvent or an ether solvent; and (iv) a first organic amine comprising at least three carbon atoms. Such compositions are particularly useful in the process of the invention. The non-polar organic solvent and the first organic amine may be as defined herein.

Preferably, the composition comprises: (i) $PbI_2$, $PbBr_2$ or $PbCl_2$; (ii) $(H_2N—C(H)=NH_2)I$, $(H_2N—C(H)=NH_2)Br$, $(H_2N—C(H)=NH_2)Cl$, $(CH_3NH_3)I$, $(CH_3NH_3)Br$ or $(CH_3NH_3)Cl$; (iii) toluene or chlorobenzene; and (iv) butylamine. More preferably, the composition comprises: (i) $PbI_2$; (ii) $(CH_3NH_3)I$ or $(H_2N—C(H)=NH_2)I$; (iii) toluene; (iv) butylamine; and (v) methylamine. The relative amounts of the components may be as define above for the precursor composition.

EXAMPLES

Example 1—solvent comprising toluene and butylamine

Figure 2:
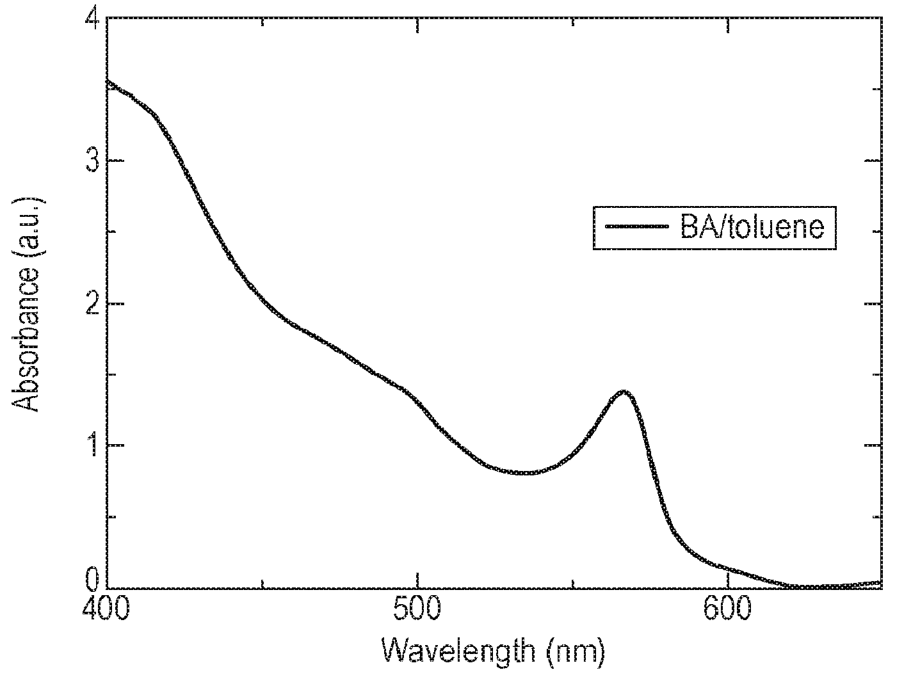
FIG. 2 shows the absorption of a perovskite film, $MA_{n-1}BA_2Pb_nI_{3n+1}$, deposited from a butylamine/toluene solvent (50:50 v/v).

A solvent comprising a 50:50 v/v mixture of butylamine/toluene was prepared. $PbI_2$ and methylammonium iodide were dissolved in the mixed solvent to form a precursor composition. The precursor composition was then used to form perovskite films. FIG. 1 shows current-voltage characteristics of a device comprising a perovskite film deposited from the mixed butylamine/toluene solvent. FIG. 2 shows the absorption of a perovskite film deposited from the butylamine/toluene solvent. From the absorption spectrum, it is inferred that the perovskite deposited from this butylamine/toluene solvent is of the crystal structure $MA_{n-1}BA_2Pb_nI_{3n+1}$.

Example 2—Solvent Comprising Toluene, Butylamine and Methylamine

Preparation of the Precursor Solution

Methylammonium iodide (Dyesol) and $PbI_2$ (TCI Chemicals) were added to 3 ml of toluene, such that a 1M solution was formed. The vial was sonicated until a dark grey suspension was obtained. A solution of methylamine (MA) in ethanol (Sigma Aldrich, 33 wt %) was placed into an aerator which was kept in an ice bath. A carrier gas ($N_2$) was then bubbled into the solution, thus degassing the solution of MA. The MA gas which was produced was then passed through a drying tube filled with a dessicant (Drierite and CaO), before it was bubbled directly into the toluene (Sigma Aldrich) which contained the perovskite precursors (methylammonium iodide and $PbI_2$). The gas was bubbled into the dark grey dispersion for 5 minutes after which 500 μl of butylamine (Sigma Aldrich) was added to the dispersion. Upon addition of the butylamine a clear, yellow solution was obtained, after which toluene was added to the solution such that the final molarity of the perovskite solution was 0.5M. PCBM was then added to the precursor solution in the desired quantity, and the solution was stirred at room temperature until the PCBM was completely dissolved.

Deposition of Perovskite Films

The perovskite films were deposited onto the desired substrate by spin coating at 2000 rpm for 45 seconds, resulting in the crystallisation of a yellow film during spin coating. The films were then annealed at 100° C. for 60 min, after which it was allowed to naturally cool down to room temperature. When the substrates were completely cool, the films were held in methylamine vapour for 10 seconds, causing a bleaching of the perovskite films. The films were then removed from the vapour and immediately placed on a hotplate after which they were annealed for 5 minutes at 100° C., resulting in the formation of a $CH_3NH_3PbI_3$ perovskite film.

Results and Discussion

Figure 3:
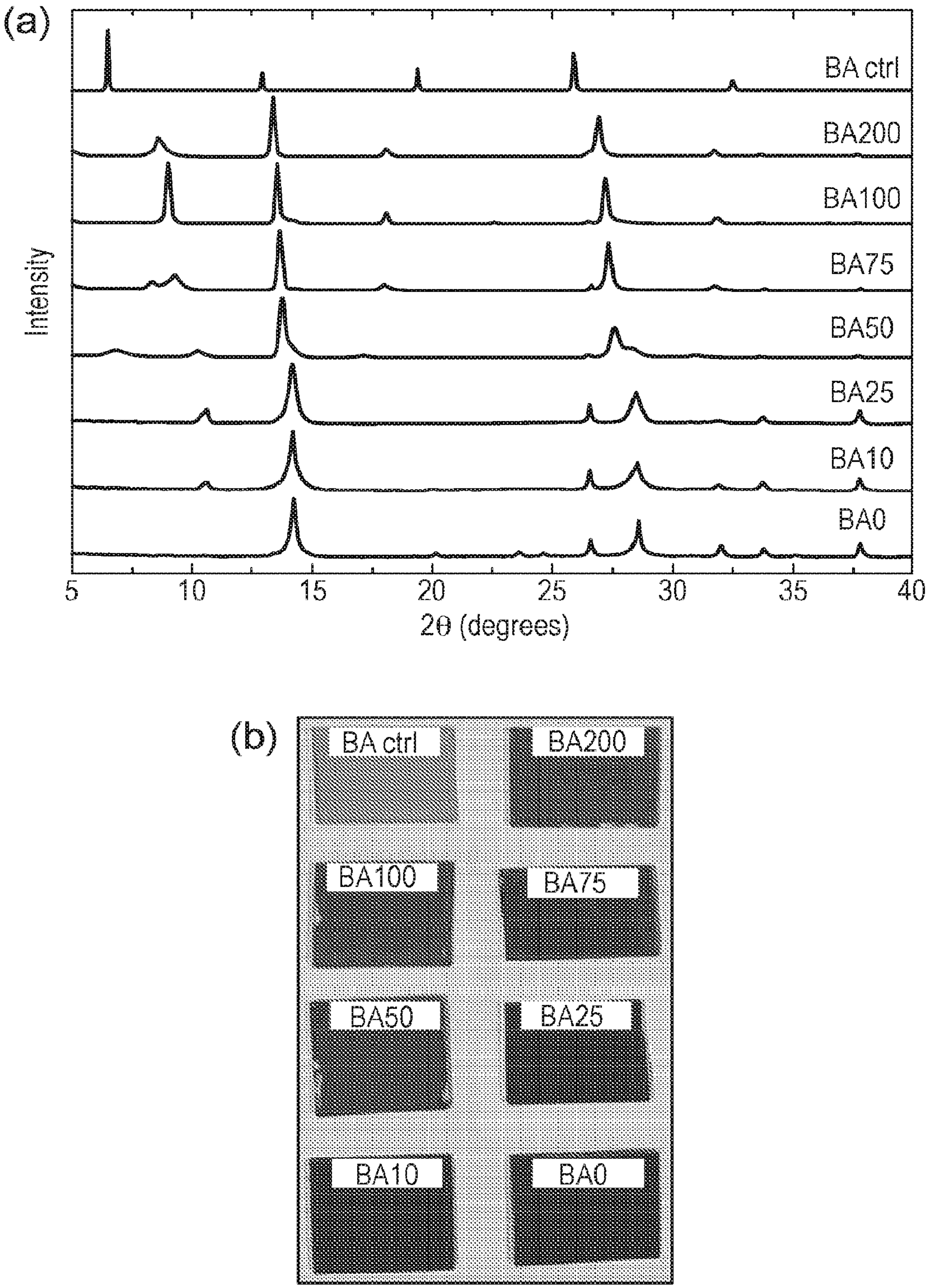
FIG. 3 shows (a) x-ray diffractograms of $MAPbI_3$ or $MA_{n-1}BA_2Pb_nI_{3n+1}$ films deposited from an acetonitrile/methylamine (ACN/MA) compound solvent with varying amounts of added butylamine (BA). The overall molarity of all solutions was kept at 0.5M. All films were annealed at 100° C. for 30 min; and (b) shows pictures of the corresponding crystallised films.

The addition of butylamine to the perovskite precursors not only causes dissolution of the material, but also results in the incorporation of butylammonium into the perovskite structure. To illustrate this, a standard 0.5 M solution of $CH_3NH_3PbI_3$ in the known ACN/MA (acetonitrile/methylamine) compound solvent was used. By adding different volumes of butylamine to a full perovskite precursor solution, it is possible to tune the composition and structure of the perovskite from the 3D $CH_3NH_3PbI_3$ to the 2D $(CH_3(CH_2)_3NH_3)_2PbI_4$. FIG. 3 shows the X-ray diffractograms and photographs of the films produced. From the XRD patterns it can be seen that even with the addition of a very small amount of BA (10 μl/ml) a small peak appears at approximately 11°, indicative of the formation of an impurity phase. Interestingly, when no MA is added to the dispersion, and BA/ACN is used as the compound solvent, the XRD pattern of the resulting film matches exactly with that of the 2D perovskite $(CH_3(CH_2)_3NH_3)_2PbI_4$. This suggests that in solutions where amines are used as solvents, there is an equilibrium between the solvent and the alkylammonium cations, whereby the solvent molecules can be protonated and thus incorporated into the crystal structure of the perovskite material.

While alkylamines which are either miscible with or soluble in non-polar organic solvents can be used to create compound solvents for the perovskite precursors, the resulting layered perovskite structure is not always desirable for photovoltaic applications. Exposure of a perovskite film to methylamine (MA) vapour can not only lead to improved crystallinity and morphology, but can also cause changes to the composition of the material. For example, a film of formamidinium lead iodide which is exposed to MA vapour can be predominantly converted to $CH_3NH_3PbI_3$. This approach was used to obtain high quality $CH_3NH_3PbI_3$ films from the BA/toluene compound solvent. To minimise the amount of excess BA in the perovskite solution, the perovskite/toluene dispersion was first saturated by bubbling MA into it for 10 mins, after which BA is added to the dispersion until the perovskite is dissolved. The films deposited from this precursor ink are then spin coated and annealed for 30 mins before being exposed to methylamine vapour, and then annealed for a further 5 minutes at 100° C. The XRD patterns and the absorption spectra of the films before and after methylamine exposure are shown in FIG. 4.

Figure 4:
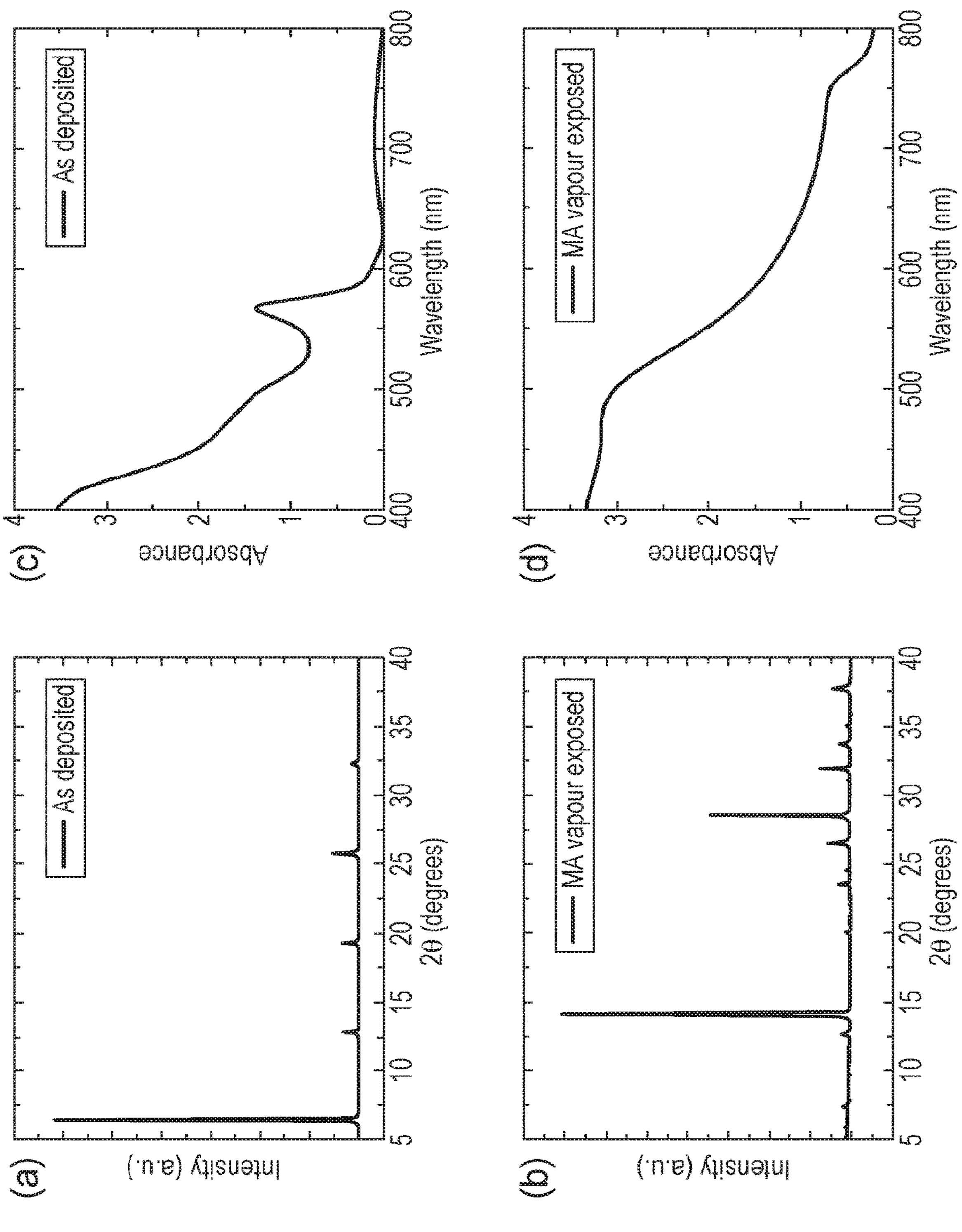
FIG. 4 shows: (a) and (b) x-ray diffraction patterns of perovskite films deposited from the MA:BA/toluene compound solvent (a) before and (b) after exposure to MA vapour; (c) and (d) absorption spectra of the perovskite films in (a) and (b). There is a transition from a $MA_{n-1}BA_2Pb_nI_{3n+1}$ perovskite film in a and c, to a $MAPbI_3$ films in b and d.

It can be seen from the X-ray diffractogram shown in FIG. 4(*a*) that the when the films are processed directly from the MA:BA/toluene solvent mixture, as with the BA/ACN solvent mixture, the layered $(CH_3(CH_2)_3NH_3)_2PbI_4$ perovskite material is formed. This is confirmed by the absorption spectra shown in FIG. 4(*c*), showing the characteristic excitonic absorption displayed by this compound. However, after exposure to MA vapour the film is transformed into the 3D $CH_3NH_3PbI_3$ displaying the characteristic XRD pattern and absorption onset at 780 nm.

Having shown that by using this sequential process it is possible to successfully fabricate a film of $CH_3NH_3PbI_3$ films from a solvent which is conventional considered an anti-solvent, the utility of this solvent system for the co-deposition of the perovskite material and organic molecules such as $C_{60}$PCBM was investigated. While PCBM is most frequently used as an extraction layer in perovskite based solar cells, studies have also shown indications that PCBM passivates defects in the perovskite layer. Given that PCBM has appreciable solubility in solvents such as toluene and chlorobenzene, the co-dissolution approach was used to investigate the impact of the PCBM on film formation of the perovskite. Scanning electron microscope images of the films produced are shown in FIG. 5.

Figure 5:
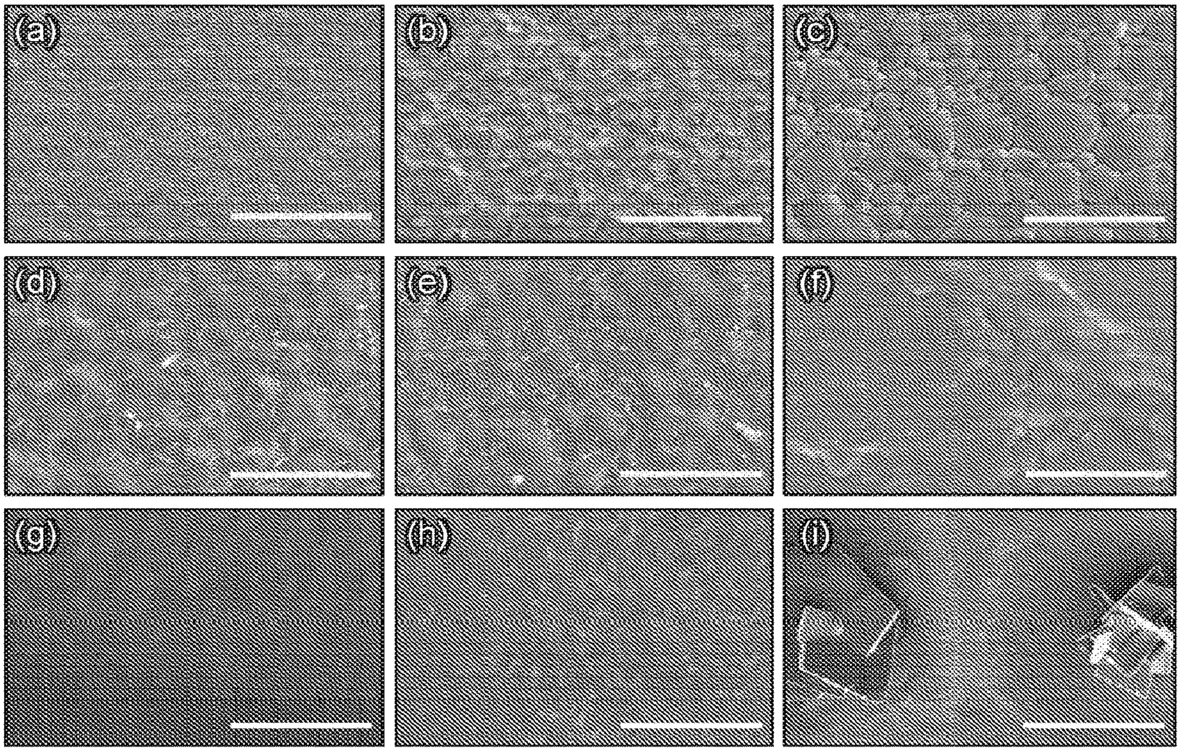
FIG. 5 shows top-view SEM images of $MAPbI_3$ perovskite films deposited from an MA:BA/toluene compound solvent, with increasing concentrations of PCBM. From (a)-(i): 0 mg/ml, 1 mg/ml, 5 mg/ml, 10 mg/ml, 15 mg/ml, 20 mg/ml, 25 mg/ml, 30 mg/ml and 40 mg/ml respectively. All scale bars represent 5 μm.

From the SEM images shown in FIG. 5, it can be seen that the inclusion of PCBM into the precursor solution does not appear to negatively impact film formation until concentrations of approximately 20 mg/ml. In fact, at lower concentrations it appears to result in the growth of larger crystal domains reaching a maximum at approximately 5 mg/ml. At 20 mg/ml phase separation of the two materials starts to be seen, where there appears to be regions of crystalline perovskite materials surrounded by PCBM. At 25 mg/ml and 30 mg/ml, the fine grain structure of the perovskite is no longer visible in the film, presumably due to being covered by a layer of organic material. However, at 40 mg/ml, the appearance of very large clusters of perovskite crystallites and an uneven distribution of material across the surface of the film is observed. It must be noted, however, that this concentration of 40 mg/ml is nearing the solubility limit for PCBM in toluene and at this concentration the precursor solution quickly becomes turbid when left to stand.

Figure 6:
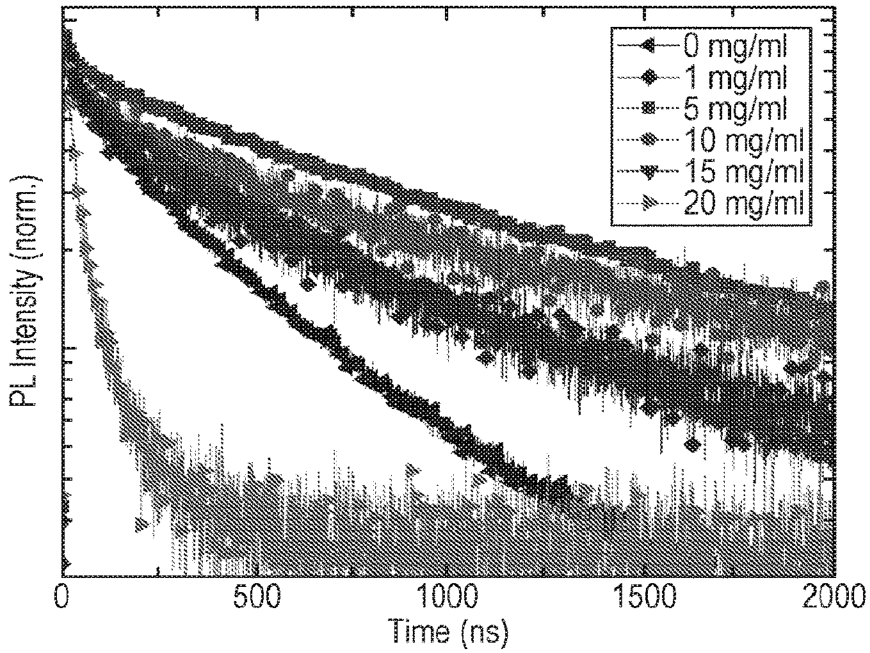
FIG. 6 shows time-resolved Photoluminescence decays of $CH_3NH_3PbI_3$ films deposited from an MA:BA/toluene compound solvent with specified amounts of PCBM added to the precursor solution. Notably the PL decay of the $CH_3NH_3PbI_3$ with no added PCBM is faster than the film with 5 mg/ml PCBM added.

The optoelectronic quality of these films was then investigated, with and without PCBM added to the precursor solution. FIG. 6 shows time-resolved photoluminescence decays of the $CH_3NH_3PbI_3$ films deposited from the MA:BA/toluene compound solvent with the specified amounts of PCBM added to the precursor solution. By fitting the PL decays lifetimes of approximately 350 ns were found for the control film with no PCBM added to the precursor solution. This value is in good agreement with literature values for $CH_3NH_3PbI_3$ values which have been reported in literature. With the addition of small amounts of PCBM, an increase in the PL lifetimes of the films was found, which reaches a maximum at 5 mg/ml of PCBM, yielding a lifetime of approximately 900 ns. This increase in PL lifetime is in agreement with literature results which have suggested that at low concentrations, PCBM can passivate grain boundaries and interfaces in perovskite films and devices. With increasing concentrations of PCBM, a decrease in the lifetime can be seen with significant quenching occurring at a 20 mg/ml. Looking at these results in the context of the changes in the crystal size and morphology of the films, it can be inferred that at PCBM concentrations higher than 15 mg/ml, there is a near complete phase separation of the materials, with a PCBM layer forming on top of the perovskite layer. As PCBM and $C_{60}$ have been shown to be extremely efficient extraction layers for perovskite solar cells, it is conceivable that at high concentrations when a near complete layer of PCBM coats the perovskite, the PL lifetime is quenched as electrons are extracted from the perovskite. While not necessarily improving the quality of the perovskite material itself, this is a promising result as this method can potentially be used to deposit both the perovskite and the electron transporting layer at once.

Figure 7:
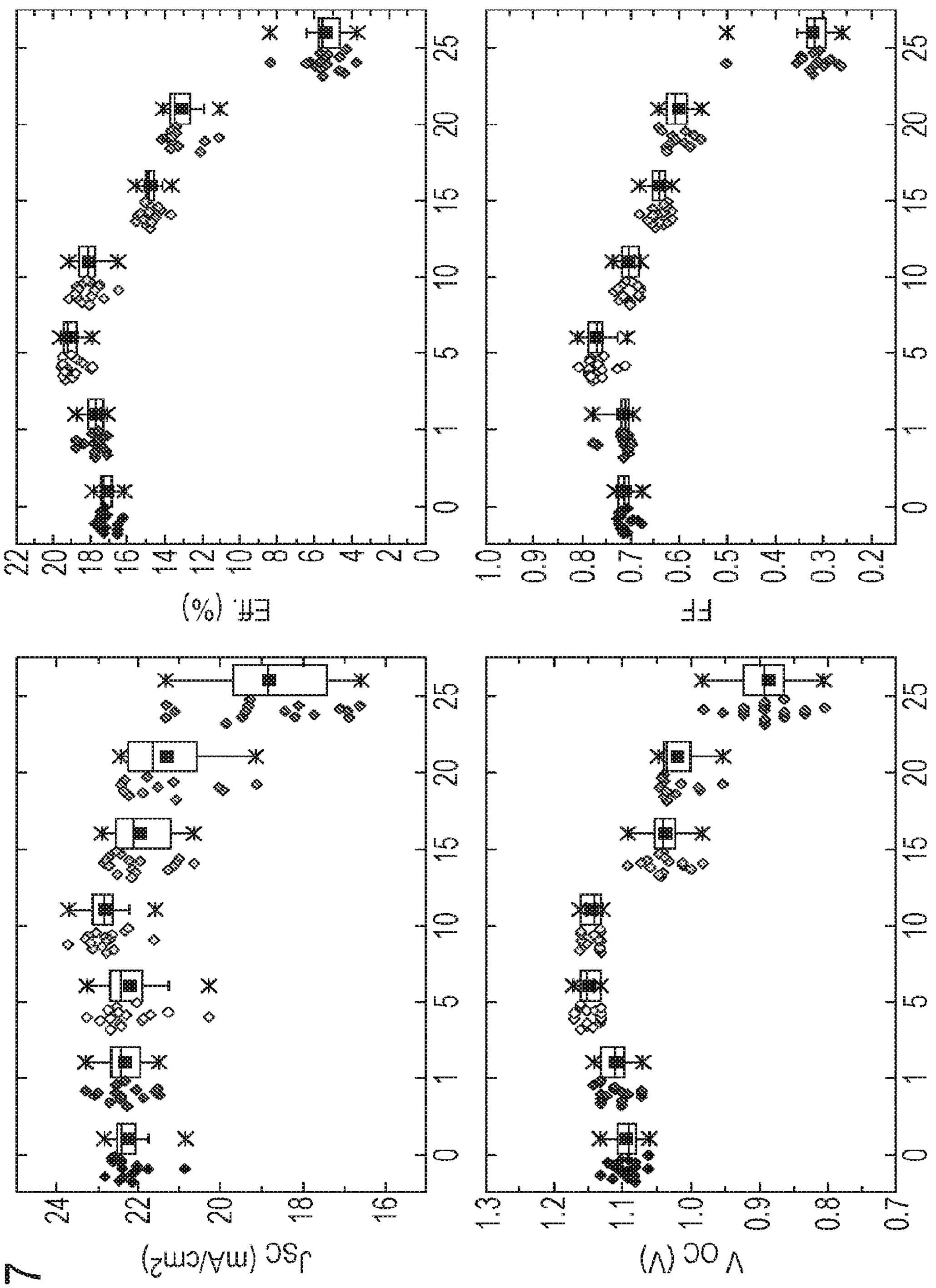
FIG. 7 shows solar cell performance parameters (short-circuit current density ($J_{sc}$) Power conversion efficiency (Eff. (%)), open-circuit voltage ($V_{oc}$), and fill factor (FF)) for solar cells measured under simulated air mass 1.5 sun light of 100 $mWcm^{-2}$ irradiance, with $CH_3NH_3PbI_3$ absorber layers with the perovskite films processed from the MA:BA/toluene compound solvent including specified concentrations of PCBM added to the precursor solutions in mg/ml of solution shown on the x-axis.
Figure 8:
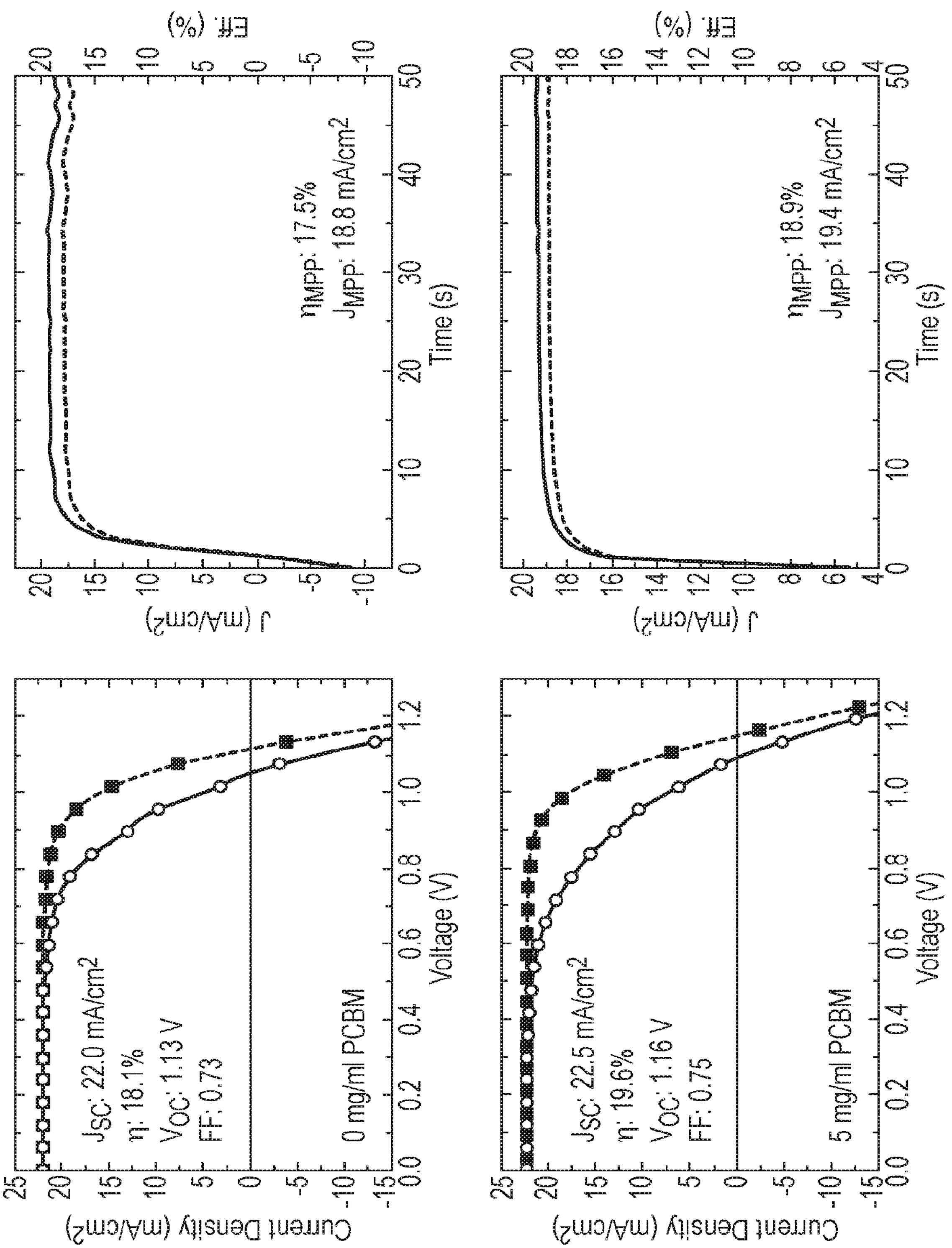
FIG. 8 shows current-voltage characteristics and steady state efficiencies of champion $CH_3NH_3PbI_3$ devices fabricated from an MA:BA/toluene compound solvent, with (bottom) and without (top) addition of PCBM.

Having assessed the optoelectronic quality of the films via optical measurements, the films were incorporated into solar cells. Here the following device structure was used: FTO/$SnO_2$/$CH_3NH_3PbI_3$/spiro-OMeTAD/Ag. The performance statistics over 4 batches of devices are shown in FIG. 7. Most notably, an increase in the $V_{OC}$ of the devices where PCBM has been added to the precursor solution is seen, with the maximum $V_{OC}$ being achieved at between 5 mg/ml and 10 mg/ml of added PCBM. When the PCBM loading is increased, a sharp drop in all performance parameters in the device is observed. These results can be correlated with the SEM images of equivalent perovskite films, where the film morphology appears to change with higher PCBM loadings. From the SEM images, it appears that at higher loadings (>15 mg/ml), more PCBM is present at the surface of the film. In the current n-i-p device architecture, this would result in direct contact with the spiro-OMeTAD layer, resulting in increased recombination at this interface, and hence an overall decrease in device performance, which is indeed what is observed in these devices. However, at PCBM loadings of 5 mg/ml where we observe the largest grain sizes and most improved PL lifetimes, highly efficient devices with scanned efficiencies of up to 19.6% with a steady-state efficiency of 18.9% can be achieved. The current-voltage characteristics of the control and test devices are given in FIG. 8.

The invention claimed is:

1. A composition comprising:

(i) a compound of formula $MX_n$, wherein: M is $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$, $Eu^{2+}$, $Bi^{3+}$, $Sb^{3+}$, $Pd^{4+}$, $W^{4+}$, $Re^{4+}$, $Os^{4+}$, $Ir^{4+}$, $Pt^{4+}$, $Sn^{4+}$, $Pb^{4+}$, $Ge^{4+}$ or $Te^{4+}$; X is $I^-$, $Br^-$, $Cl^-$ or $F^-$; and n is 2, 3 or 4;

(ii) a compound of formula AX, wherein A is selected from $(R^1NH_3)^+$, $(NR^2_4)^+$ and $(H_2N{-}C(R^1){=}NH_2)^+$, wherein $R^1$ is H or an unsubstituted $C_{1-6}$ alkyl group and each $R^2$ is an unsubstituted $C_{1-6}$ alkyl group, and X is $I^-$, $Br^-$, $Cl^-$ or $F^-$;

(iii) a non-polar organic solvent which is a hydrocarbon solvent, a chlorohydrocarbon solvent or an ether solvent; and (iv) a first organic amine comprising at least three carbon atoms, characterized in that the composition comprises the non-polar organic solvent and the first organic amine in a volume ratio (non-polar organic solvent): (first organic amine) of from 40:1 to 1:2.

2. A composition according to claim 1, wherein the non-polar organic solvent is toluene, benzene, xylene, chlorobenzene, dichlorobenzene, chloroform, anisole, hexane, pentane, cyclohexane or cyclopentane.

3. A composition according to claim 1, wherein the first organic amine is a first alkylamine of formula $R^ANH_2$ or a first arylamine of formula $ArNH_2$, wherein $R^A$ is an unsubstituted $C_{3-20}$ alkyl group or a $C_{3-20}$ alkyl group substituted with a phenyl group; and Ar is an unsubstituted phenyl group or phenyl group substituted with from one to three $C_{1-6}$ alkyl groups.

4. A composition according to claim 3, wherein the first organic amine is a first alkylamine which is propylamine, butylamine, pentylamine, hexylamine or phenylethylamine.

5. A composition according to claim 1, wherein the volume ratio (non-polar organic solvent):(first organic amine) is from 20:1 to 4:1.

6. A composition according to claim 1, wherein the composition further comprises an organic material.

7. A composition according to claim 6, wherein the organic material is an organic dielectric material, an organic semiconducting material, an organic polymer, a fullerene derivative, an organic reducing agent or an organic oxidizing agent.

8. A composition according to claim 6, wherein the organic material is:

an organic semiconducting material selected from poly(4-butylphenyldiphenylamine), poly(N,N'-bis-4-butylphenyl-N,N'-bisphenyl)benzidine (polyTPD), a poly(triarylamine) (PTAA), a spiro-bi-fluorene compound, spiro-OMeTAD, a polymer comprising thiophene, poly(3-hexyl thiophene), poly(3,4-ethylenedioxythiophene) (PEDOT), a rylene derivative, perylene, poly[(9,9-dioctylfluorenyl-2,7-diyl)-co-(4,4'-(N-(4-sec-butylphenyl) diphenylamine)] (TFB), poly(9,9-dioctylfluorenyl-2,7-diyl) (F8), poly(9-vinylcarbazole) (PVK), 4,4'-Bis(carbazol-9-yl) biphenyl (CBP), poly[(9,9-dioctylfluorenyl-2,7-diyl)-alt-(benzo[2,1,3] thiadiazol-4,7-diyl)] (F8BT), poly(3-hexylthiophene-2,5-diyl) (P3HT), phenyl-C61-butyric acid methyl ester (PCBM) and diphenylanthracene (DPA);

an organic dielectric material selected from poly(methylmethacrylate) (PMMA), polystyrene, poly(vinyl acetate) and ethylene-vinyl acetate (EVA); or an organic reducing agent or an organic oxidizing agent selected from 2,3,5,6-tetrafluoro-7,7,8,8-tetracyanoquinodimethane (F4TCNQ), hexafluorotetra-cyanonaphthoquinodimethane (F6TCNNQ), a molybdenum compound, molybdenum tris (dithiolene), pentamethylcyclopentadienyl cyclopentadienyl rhodium dimer, decamethylcobaltocene (DMC) and 3-dimethyl-2-phenyl-2,3-dihydro-1H-benzoimidazole (N-DMBI).

9. A composition according to claim 1, wherein the solvent further comprises a second alkylamine.

10. A composition according to claim 1, wherein the composition comprises:

(i) $PbI_2$, $PbBr_2$ or $PbCl_2$;

(ii) $(H_2N—C(H)=NH_2)I$, $(H_2N—C(H)=NH_2)Br$, $(H_2N—C(H)=NH_2)Cl$, $(CH_3NH_3)I$, $(CH_3NH_3)Br$ or $(CH_3NH_3)Cl$;

(iii) toluene or chlorobenzene; and (iv) butylamine.

11. A composition according to claim 1 wherein the composition comprises:

(i) $PbI_2$;

(ii) $(CH_3NH_3)I$ or $(H_2N—C(H)=NH_2)I$;

(iii) toluene;

(iv) butylamine; and (v) methylamine.

12. A composition according to claim 1 wherein M is $Cu^{2+}$, $Pb^{2+}$, $Ge^{2+}$ or $Sn^{2+}$.

* * * * *